United States Patent
Price et al.

(10) Patent No.: US 10,345,834 B2
(45) Date of Patent: Jul. 9, 2019

(54) SENSING TOTAL CURRENT OF DISTRIBUTED LOAD CIRCUITS INDEPENDENT OF CURRENT DISTRIBUTION USING DISTRIBUTED VOLTAGE AVERAGING

(71) Applicant: QUALCOMM Incorporated, San Diego, CA (US)

(72) Inventors: Burt Lee Price, Apex, NC (US); Yeshwant Nagaraj Kolla, Wake Forest, NC (US); Dhaval Rajeshbhai Shah, Raleigh, NC (US); Jin Liang, Apex, NC (US); Yu Sun, Raleigh, NC (US); Hans Lee Yeager, Chapel Hill, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/672,356

(22) Filed: Aug. 9, 2017

(65) Prior Publication Data

US 2019/0050009 A1     Feb. 14, 2019

(51) Int. Cl.
*G01R 19/28*     (2006.01)
*G05F 1/565*     (2006.01)
(Continued)

(52) U.S. Cl.
CPC .......... *G05F 1/565* (2013.01); *G01R 19/003* (2013.01); *G01R 19/10* (2013.01);
(Continued)

(58) Field of Classification Search
CPC .......... H02H 3/087; H02H 1/06; G01R 19/28; G01R 19/0023; H02M 2001/009; G05F 1/565

See application file for complete search history.

(56) References Cited

U.S. PATENT DOCUMENTS 3,919,565 A * 11/1975 Clark ............... H02H 3/087
                                                          327/88
4,765,878 A      8/1988 Komoto et al.
(Continued)

FOREIGN PATENT DOCUMENTS

EP        1458224 A2    9/2004

OTHER PUBLICATIONS

Author Unknown, "Low Voltage High Input Impedance Precision DC Summing Amplifier," Nov. 8, 2005, Advanced Linear Devices, Inc., Retrieved from http://www.aldinc.com/pdf/amp_27002.0.pdf, 1 page.
(Continued)

*Primary Examiner* — Harry R Behm
(74) *Attorney, Agent, or Firm* — W&T/Qualcomm

(57) ABSTRACT

Aspects for sensing total current of distributed load circuits independently of a spatial profile of the total current using distributed voltage averaging are disclosed. In one aspect, a current sense circuit is configured to sense total current of a distributed load circuit independently of where current is distributed. The current sense circuit includes distributed voltage averaging circuits configured to determine average voltages of the distributed load circuit based on voltages sensed at multiple resistive paths corresponding to a distribution network configured to provide voltage to the distributed load circuit. An amplifier includes an output node having an output voltage that is proportional to total current flowing in the distributed load circuit. The current sense circuit allows for sensing total current independent of where the current flows, providing more accurate current sensing compared to sensing current in one area of the distributed load circuit.

25 Claims, 12 Drawing Sheets

(51) Int. Cl.
  *G01R 19/00* (2006.01)
  *G01R 19/10* (2006.01)
  *H02M 1/00* (2006.01)
(52) U.S. Cl.
  CPC .......... *G01R 19/0092* (2013.01); *G01R 19/28* (2013.01); *H02M 2001/0009* (2013.01)

(56) References Cited

U.S. PATENT DOCUMENTS

| | | | |
|---|---|---|---|
| 5,448,155 A | 9/1995 | Jutras | |
| 6,157,555 A | 12/2000 | Hemena et al. | |
| 6,429,728 B1 | 8/2002 | Zabinski | |
| 6,943,535 B1* | 9/2005 | Schiff | H02M 3/1584 323/244 |
| 7,936,088 B2 | 5/2011 | Orr et al. | |
| 9,494,957 B2 | 11/2016 | Price et al. | |
| 2002/0145839 A1* | 10/2002 | Smith | G06F 1/26 361/88 |
| 2005/0200340 A1* | 9/2005 | Jochum | H02M 3/1584 323/280 |
| 2005/0283325 A1* | 12/2005 | Mottola | G01R 19/0092 702/64 |
| 2007/0271473 A1 | 11/2007 | Hosomi | |
| 2008/0054724 A1 | 3/2008 | Hosomi et al. | |
| 2010/0148738 A1* | 6/2010 | Schiff | H02M 3/157 323/282 |
| 2011/0018344 A1 | 1/2011 | Liao et al. | |
| 2011/0153242 A1 | 6/2011 | Gao et al. | |
| 2012/0327563 A1* | 12/2012 | Cook | H02J 4/00 361/624 |
| 2014/0300346 A1* | 10/2014 | Zhang | G01R 19/0092 324/120 |
| 2016/0124030 A1* | 5/2016 | Zhang | G01R 19/0092 324/605 |
| 2016/0270167 A1 | 9/2016 | Franck et al. | |
| 2017/0016938 A1* | 1/2017 | Takeuchi | G01R 15/08 |
| 2017/0033554 A1* | 2/2017 | Vail | H02H 3/087 |
| 2017/0212154 A1 | 7/2017 | Otsuka et al. | |
| 2018/0188292 A1* | 7/2018 | Hu | G01R 19/0092 |
| 2018/0247678 A1* | 8/2018 | Vergis | G11C 5/147 |

OTHER PUBLICATIONS

International Search Report and Written Opinion for International Patent Application No. PCT/US2018/042229, dated Dec. 14, 2018, 21 pages.

* cited by examiner

SENSING TOTAL CURRENT OF DISTRIBUTED LOAD CIRCUITS INDEPENDENT OF CURRENT DISTRIBUTION USING DISTRIBUTED VOLTAGE AVERAGING

BACKGROUND

I. Field of the Disclosure

The technology of the disclosure relates generally to sensing current in circuits, and more particularly to sensing current of distributed load circuits.

II. Background

Preventing or avoiding excessive current is a problem of increasing concern in integrated circuit (IC) design, particularly because excessive current in an IC can cause circuit failure. This problem has become especially critical as voltage scaling has slowed down and the number of active components per unit area has increased. In this regard, the total current of an IC fabricated on a semiconductor die, such as a microprocessor or cache memory, may be determined or estimated by performing an on-die current measurement of the IC. As a non-limiting example, an on-die current measurement system may employ a precise current sense resistor on the semiconductor die to determine whether the current flowing in the IC exceeds a defined current threshold. If the measured current exceeds the defined current threshold, a control system corresponding to the IC may be configured to perform certain functions that reduce the current so as to avoid circuit failures caused by excessive current.

Although the current of the IC may be measured using an on-die current measurement system on a semiconductor die, accurately measuring current within the IC may be difficult. In particular, because voltage distribution, and hence current distribution, may differ across distributed load circuit elements within an IC, the current profile of a particular area of an IC is not necessarily indicative of the current profile of other areas of the IC or the entire IC. For example, a first current distributed to a first area of an IC may be different from a second current distributed to a second area of the IC. Thus, measuring current in one particular area of an IC may not provide an accurate representation of overall current within the IC. Inaccurate current measurements within the IC may reduce the effectiveness of current control functions employed to prevent circuit failures.

In this regard, it would be advantageous to more accurately measure current in light of varying voltage and current profiles across distributed elements within an IC. In particular, providing more accurate current measurements may improve results of a corresponding control system that uses the current measurement to adjust the current so as to reduce or avoid circuit failures caused by excessive current.

SUMMARY OF THE DISCLOSURE

Aspects disclosed in the detailed description include sensing total current of distributed load circuits independent of current distribution using distributed voltage averaging. In one aspect, because current flowing in one area of a distributed load circuit may vary from current flowing in a second area of the same distributed load circuit, a current sense circuit is configured to sense a total current of the distributed load circuit independently of where the current is distributed in the distributed load circuit. For example, a first area of a distributed load circuit may have more active circuits compared to a second area of the distributed load circuit such that more current is distributed to the first area. In aspects disclosed herein, the current sense circuit includes distributed voltage averaging circuits each configured to determine average voltages of the distributed load circuit based on voltages of multiple resistive paths corresponding to a distribution network that is configured to provide voltage to the distributed load circuit. The current sense circuit also includes an amplifier with an output node having an output voltage that correlates to the difference of the average voltages multiplied by a gain of the amplifier. The voltage differential of the average voltages is proportional to the total current. Further, the amplifier can be calibrated based on an effective resistance of the resistive paths such that the output voltage is amplified while still being proportional to the total current flowing to the distributed load circuit. Because the output voltage is proportional to the total current, a control circuit can use the output signal to adjust the frequency of various circuits corresponding to the distributed load circuit to prevent the total current from exceeding a current threshold. In this manner, the current sense circuit allows for sensing total current independent of where the current flows (i.e., the current distribution), thus providing a more accurate measurement compared to sensing current in a particular area of the distributed load circuit. More accurate current sensing may improve the function of a corresponding control circuit that uses the sensed current to adjust current so as to reduce or avoid circuit failures caused by excessive current.

In this regard in one aspect, a current sense circuit for sensing a current of a distributed load circuit is provided. The current sense circuit comprises a first distributed voltage averaging circuit. The first distributed voltage averaging circuit comprises a plurality of resistive circuits. Each resistive circuit of the plurality of resistive circuits comprises an input node electrically coupled to a node of a corresponding resistive path of a plurality of resistive paths corresponding to a distribution network configured to distribute voltage from a corresponding voltage supply to a corresponding distributed load circuit. Each resistive circuit also comprises an output node. The first distributed voltage averaging circuit also comprises a first voltage output node electrically coupled to the output node of each resistive circuit of the first distributed voltage averaging circuit and having a first average voltage of the distributed load circuit. The current sense circuit also comprises a second distributed voltage averaging circuit. The second distributed voltage averaging circuit comprises a plurality of resistive circuits. Each resistive circuit of the plurality of resistive circuits comprises an input node electrically coupled to a node of a corresponding resistive path of a plurality of resistive paths corresponding to the distribution network. Each resistive circuit also comprises an output node. The second distributed voltage averaging circuit also comprises a second voltage output node electrically coupled to the output node of each resistive circuit of the second distributed voltage averaging circuit and having a second average voltage of the distributed load circuit. The current sense circuit also comprises an amplifier. The amplifier comprises a first input node electrically coupled to the first voltage output node. The amplifier also comprises a second input node electrically coupled to the second voltage output node. The amplifier also comprises an output node. The amplifier is configured to provide an output voltage on the output node proportional to a total current of the distributed load circuit.

In another aspect, a current sense circuit for sensing a current of a distributed load circuit is provided. The current sense circuit comprises a means for determining a first average voltage corresponding to a plurality of resistive paths corresponding to a distribution network configured to distribute voltage from a corresponding voltage supply to a corresponding distributed load circuit. The current sense circuit also comprises a means for determining a second average voltage corresponding to a plurality of resistive paths corresponding to the distribution network. The current sense circuit also comprises a means for providing an output voltage correlating to a difference of the first average voltage and the second average voltage, wherein the output voltage is proportional to a total current of the distributed load circuit.

In another aspect, a method for sensing a current of a distributed load circuit independent of current distribution is provided. The method comprises determining a first average voltage corresponding to a plurality of resistive paths corresponding to a distribution network configured to distribute voltage from a corresponding voltage supply to a corresponding distributed load circuit. The method also comprises determining a second average voltage corresponding to a plurality of resistive paths corresponding to the distribution network. The method also comprises providing an output voltage correlating to a difference of the first average voltage and the second average voltage, wherein the output voltage is proportional to a total current of the distributed load circuit.

In another aspect, a circuit system is provided. The circuit system comprises a package comprising a distribution network, wherein the distribution network comprises a plurality of resistive paths and is configured to distribute voltage from a corresponding voltage supply to a corresponding distributed load circuit. The circuit system also comprises a semiconductor die comprising the distributed load circuit, wherein the distributed load circuit comprises a plurality of circuits. The circuit system also comprises a current sense circuit configured to sense a total current of the distributed load circuit. The current sense circuit comprises a first distributed voltage averaging circuit. The first distributed voltage averaging circuit comprises a plurality of resistive circuits. Each resistive circuit of the plurality of resistive circuits comprises an input node electrically coupled to a node of a corresponding resistive path. Each resistive circuit also comprises an output node. The first distributed voltage averaging circuit also comprises a first voltage output node electrically coupled to the output node of each resistive circuit of the first distributed voltage averaging circuit and having a first average voltage of the distributed load circuit. The current sense circuit also comprises a second distributed voltage averaging circuit. The second distributed voltage averaging circuit comprises a plurality of resistive circuits. Each resistive circuit of the plurality of resistive circuits comprises an input node electrically coupled to a node of a corresponding resistive path. Each resistive circuit also comprises an output node. The second distributed voltage averaging circuit also comprises a second voltage output node electrically coupled to the output node of each resistive circuit of the second distributed voltage averaging circuit and having a second average voltage of the distributed load circuit. The current sense circuit also comprises an amplifier. The amplifier comprises a first input node electrically coupled to the first voltage output node. The amplifier also comprises a second input node electrically coupled to the second voltage output node. The amplifier also comprises an output node. The amplifier is configured to provide an output voltage on the output node of the amplifier proportional to the total current of the distributed load circuit. The circuit system also comprises an analog-to-digital converter comprising an input node coupled to the output node of the amplifier and an output node having a digital signal that is a digital representation of the output voltage. The circuit system also comprises a control circuit. The control circuit is configured to receive the digital signal. The control circuit is also configured to, responsive to the digital signal exceeding a defined threshold value, adjust one or more parameters of one or more circuits of the plurality of circuits of the distributed load circuit operate such that the total current is less than or equal to a maximum current level.

DETAILED DESCRIPTION

Figure 1:
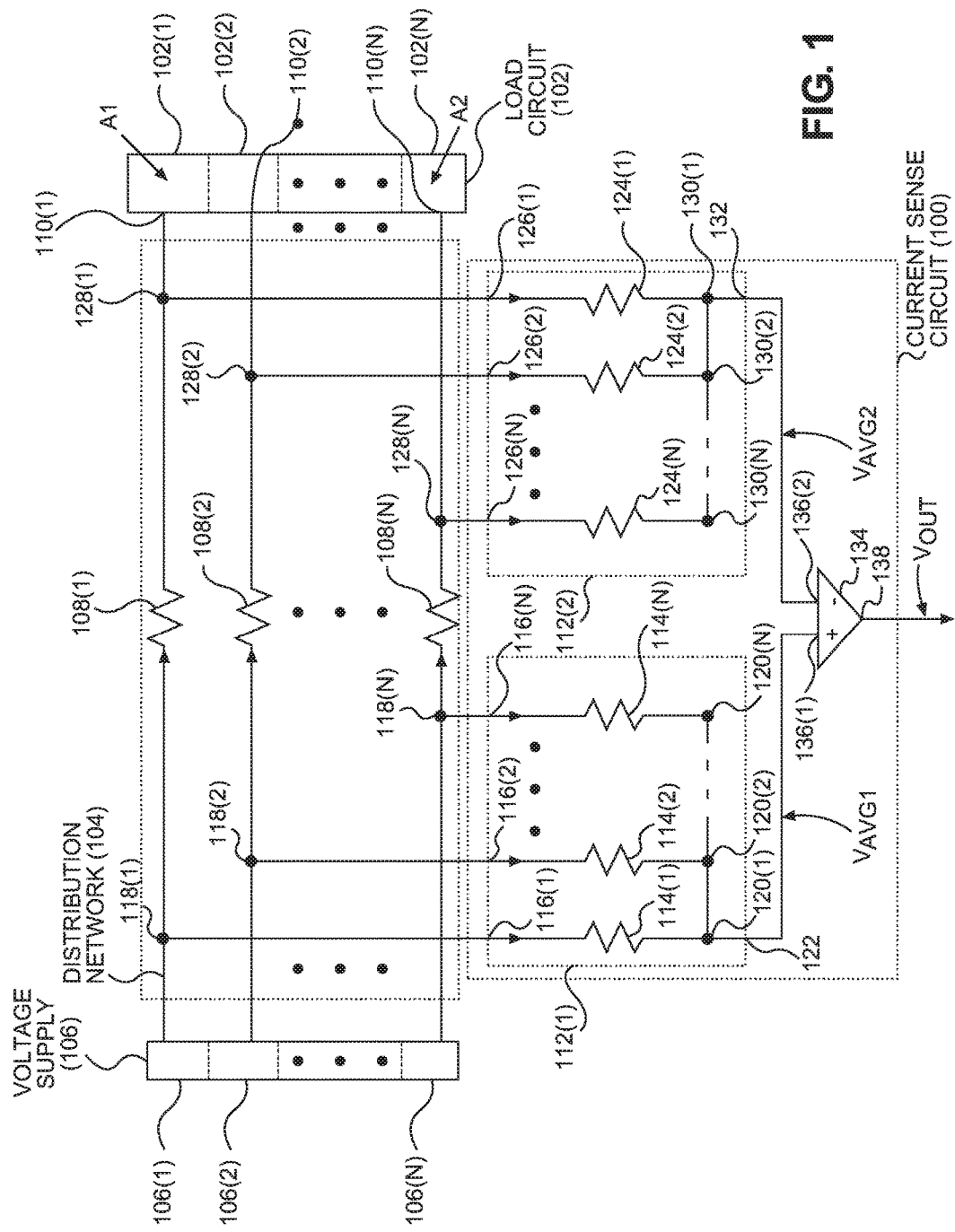
FIG. 1 is a circuit diagram of an exemplary current sense circuit configured to sense total current of a distributed load circuit independent of current distribution using distributed voltage averaging of voltages corresponding to a distribution network configured to distribute voltage to the distributed load circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

FIG. 1 illustrates an exemplary current sense circuit 100 configured to sense total current ($I_T$) of a distributed load circuit 102 independent of current distribution (i.e., the spatial profile of the total current) using distributed voltage averaging of voltages corresponding to a distribution network 104 configured to distribute voltage (V) from a voltage supply 106 to the distributed load circuit 102. In other words, current flowing in one area A1 of the distributed load circuit 102 may vary from current flowing in a second area A2 of the same distributed load circuit 102. Thus, the current sense circuit 100 is configured to sense the total current ($I_T$) in the distributed load circuit 102 independently of where the total current ($I_T$) is distributed. In particular, the current sense circuit 100 is configured to tap voltages from multiple areas of the distribution network 104 to determine average voltages ($V_{AVG1}$), ($V_{AVG2}$) (also referred to as first and second average voltages $V_{AVG1}$, $V_{AVG2}$) distributed to the distributed load circuit 102. The current sense circuit 100 uses the average voltages ($V_{AVG1}$) ($V_{AVG2}$) to determine an output voltage ($V_{OUT}$) that is proportional to the total current ($I_T$) of the distributed load circuit 102 based on an effective resistance ($R_{eff}$) of the distribution network 104. Sensing the total current ($I_T$) in this manner provides a more accurate measurement of the total current ($I_T$) compared to sensing current in a particular area of the distributed load circuit 102. As discussed in greater detail, the current sense circuit 100 can be configured to sense the total current ($I_T$) for a duration of time so as to account for changes in the effective resistance ($R_{eff}$) over time.

With continuing reference to FIG. 1, the voltage (V) of the voltage supply 106 is distributed across resistive paths 108(1)-108(N) of the distribution network 104 to the distributed load circuit 102. Although this aspect illustrates the single voltage supply 106 and the single distributed load circuit 102, it is to be understood that the voltage supply 106 may include multiple voltage supplies 106(1)-106(N) and the distributed load circuit 102 may include multiple distributed load circuits 102(1)-102(N). In this manner, each corresponding voltage supply 106(1)-106(N) may provide an independent voltage (V1)-(VN) to the corresponding distributed load circuit 102(1)-102(N) that is either equal to or not equal to the voltage (V1)-(VN) provided by any other voltage supply 106(1)-106(N). In other words, a voltage (V1) provided by the voltage supply 106(1) to the distributed load circuit 102(1) over the resistive path 108(1) may be independent of the voltage (V2) provided by the voltage supply 106(2) to the distributed load circuit 102(2) over the resistive path 108(2). Further, as used herein, a resistive path 108(1)-108(N) includes a defined portion of the distribution network 104 having a resistance (R). In this example, each resistive path 108(1)-108(N) has a corresponding resistance (R) and is electrically coupled to a corresponding load node 110(1)-110(N) of the distributed load circuit 102. Although not illustrated in FIG. 1, each length of wire that electrically couples the voltage supply 106 and the resistive paths 108(1)-108(N), as well as each length of wire that electrically couples the distributed load circuit 102 and the resistive paths 108(1)-108(N), has a parasitic resistance that is negligible to the calculations discussed herein. The current sense circuit 100 includes distributed voltage averaging circuits 112(1), 112(2) (also referred to as first and second distributed voltage averaging circuits 112(1), 112(2)) configured to tap voltages of the distribution network 104 to determine the average voltages ($V_{AVG1}$), ($V_{AVG2}$), respectively. The average voltages ($V_{AVG1}$), ($V_{AVG2}$) are each determined based on voltages (V) of corresponding portions of the resistive paths 108(1)-108(N).

In particular, with continuing reference to FIG. 1, the first distributed voltage averaging circuit 112(1) includes resistive circuits 114(1)-114(N) each having a corresponding resistance (R(i)), wherein as discussed in more detail below, each resistance (R(i)) can be weighted based on asymmetry of the total current ($I_T$). While this aspect employs a separate resistor for each resistive circuit 114(1)-114(N), other aspects may use alternative circuit elements for each resistive circuit 114(1)-114(N), such as a length of wire having a certain resistive value, as a non-limiting example. Each resistive circuit 114(1)-114(N) includes an input node 116(1)-116(N) electrically coupled to a node 118(1)-118(N) of the corresponding resistive path 108(1)-108(N) so as to tap voltages of the distribution network 104 at the nodes 118(1)-118(N). Each resistive circuit 114(1)-114(N) also includes a corresponding output node 120(1)-120(N) electrically coupled to a voltage output node 122 (also referred to as first voltage output node 122) of the first distributed voltage averaging circuit 112(1). Coupling each output node 120(1)-120(N) while each input node 116(1)-116(N) is coupled to a corresponding node 118(1)-118(N) results in the voltage output node 122 having the average voltage ($V_{AVG1}$) of the distributed load circuit 102. More specifically, the average voltage ($V_{AVG1}$) may be calculated using a resistance (R) of each resistive circuit 114(1)-114(N) and a voltage (V) of each node 118(1)-118(N) by way of Equation 1:

$$V_{AVG1} = (R(114(1)) \| R(114(2)) \| \ldots R(114(N))) * (V(118(1))/R(114(1)) + V(118(2))/R(114(2)) + \ldots V(118(N))/R(114(N))) \quad \text{Eq. 1}$$

which can also be expressed in terms of a total resistance ($R_T$) of the resistive circuits 114(1)-114(N) using Equation 2:

$$V_{AVG1}=R_T(114)*\Sigma_{i=1}^{N}(V(118(i))/R(114(i))) \quad \text{Eq. 2}$$

With continuing reference to FIG. 1, the second distributed voltage averaging circuit 112(2) includes resistive circuits 124(1)-124(N) each having a corresponding resistance (R(i)), wherein as discussed in more detail below, each resistance (R(i)) can be weighted based on asymmetry of the total current ($I_T$). While this aspect employs a separate resistor for each resistive circuit 124(1)-124(N), other aspects may use alternative circuit elements for each resistive circuit 124(1)-124(N), such as a length of wire having a certain resistive value, as a non-limiting example. Each resistive circuit 124(1)-124(N) includes an input node 126(1)-126(N) electrically coupled to a node 128(1)-128(N) of the corresponding resistive path 108(1)-108(N) so as to tap voltages of the distribution network 104 at the nodes 128(1)-128(N). Each resistive circuit 124(1)-124(N) also includes an output node 130(1)-130(N) electrically coupled to a voltage output node 132 (also referred to as a second voltage output node 132) of the second distributed voltage averaging circuit 112(2). Coupling each output node 130(1)-130(N) while each input node 126(1)-126(N) is coupled to a corresponding node 128(1)-128(N) results in the voltage output node 132 having the average voltage ($V_{AVG2}$) of the distributed load circuit 102. More specifically, the average voltage ($V_{AVG2}$) may be calculated using a resistance (R) of each resistive circuit 124(1)-124(N) and a voltage (V) of each node 128(1)-128(N) by way of Equation 3:

$$V_{AVG2}=(R(124(1))\|R(124(2))\|\ldots R(124(N)))*(V(128(1))/R(124(1))+V(128(2))/R(124(2))+\ldots V(128(N))/R(124(N))) \quad \text{Eq. 3}$$

which can also be expressed in terms of a total resistance ($R_T$) of the resistive circuits 124(1)-124(N) using Equation 4:

$$V_{AVG2}=R_T(124)*\Sigma_{i=1}^{N}(V(128(i))/R(124(i))) \quad \text{Eq. 4}$$

With continuing reference to FIG. 1, the current sense circuit 100 also includes an amplifier 134 with first and second input nodes 136(1), 136(2) electrically coupled to the first and second voltage output nodes 122, 132, respectively, so as to receive the corresponding average voltages ($V_{AVG1}$), ($V_{AVG2}$). The amplifier 134 is configured to provide the output voltage ($V_{OUT}$) on an output node 138 of the amplifier 134, wherein the output voltage ($V_{OUT}$) correlates to the difference of the average voltages ($V_{AVG1}$), ($V_{AVG2}$) (i.e., $V_{OUT}$ correlates to ($V_{AVG1}-V_{AVG2}$)). It is worth noting that the voltage differential of the first and second average voltages ($V_{AVG1}$), ($V_{AVG2}$), is proportional to the total load current ($I_T$). Further, a gain of the amplifier 134 can be calibrated based on the effective resistance ($R_{eff}$) of the resistive paths 108(1)-108(N) of the distribution network 104 such that the output voltage ($V_{OUT}$) is amplified while still being proportional to the total current ($I_T$) flowing to the distributed load circuit 102.

In particular, the total current ($I_T$) can be expressed as a summation of each current ($I_i$) of each resistive path 108(i). Further, each current ($I_i$) is approximately equal to a difference of a voltage (V) at a node 118(i) and a voltage (V) at a node 128(i) of the corresponding resistive path 108(i) (e.g., a voltage (V) across the corresponding resistive path 108(i)), divided by a resistance (R) of each corresponding resistive path 108(i), as shown in Equation 5:

$$I_T=\Sigma_{i=1}^{N}Ii=\Sigma_{i=1}^{N}(V(118(i))-V(128(i)))/R(108(i)) \quad \text{Eq. 5}$$

Further, the effective resistance ($R_{eff}$) of the distribution network 104 is approximately equal to the parallel combination of the resistance (R) of each resistive path 108(1)-108(N), as shown in Equation 6:

$$R_{eff}=(R(108(1))\|R(108(2))\|\ldots R(108(N))) \quad \text{Eq. 6}$$

Thus, the total current can be expressed using the effective resistance ($R_{eff}$), as shown in Equation 7:

$$I_T=\Sigma_{i=1}^{N}a(i)*((V(118(i))-V(128(i)))/\text{Reff})) \quad \text{Eq. 7}$$

wherein a(i) is a scaling factor determined according to Equation 8:

$$a(i)=R_T(114)/R(114(i)), a(i)=R_T(124)/R(124(i)) \quad \text{Eq. 8}$$

As noted above, the resistive circuits 114(1)-114(N) of the first distributed voltage averaging circuit 112(1) each may have a different resistance (R(i)) that is weighted based on asymmetry of the total current ($I_T$). In particular, the resistance (R(i)) of each resistive circuit 114(1)-114(N) can be calculated and weighted using the desired total resistance ($R_T$) of the resistive circuits 114(1)-114(N) and the scaling factor a(i) using Equation 9:

$$R(114(i))=R_T(114)/a(i) \quad \text{Eq. 9}$$

Similarly, as also noted above, the resistive circuits 124(1)-124(N) of the second distributed voltage averaging circuit 112(2) each may have a different resistance (R(i)) that is weighted based on asymmetry of the total current ($I_T$). In particular, the resistance (R(i)) of each resistive circuit 124(1)-124(N) can be calculated and weighted using the desired total resistance ($R_T$) of the resistive circuits 124(1)-124(N) and the scaling factor a(i) using Equation 10:

$$R(124(i))=R_T(124)/a(i) \quad \text{Eq. 10}$$

In this regard, in cases wherein the resistance (R(i)) of the resistive circuits 114(1)-114(N), 124(1)-124(N) are either non-weighted or weighted, Equations 1-8 above can be used to calculate the total current ($I_T$), which can be expressed using Equation 11:

$$I_T=(V_{AVG1}-V_{AVG2})/R_{eff} \quad \text{Eq. 11}$$

Further, Equations 1-11 may be used when each resistive path 108(1)-108(N) has a substantially equal resistance (R), or alternatively, when at least one resistive path 108(1)-108(N) has a resistance (R) not equal or substantially equal to the resistance (R) of the remaining resistive paths 108(1)-108(N). Additionally, if each resistive path 108(1)-108(N) has a substantially equal resistance (R), Equation 12 may be used in place of Equation 11:

$$I_T=(V_{AVG1}-V_{AVG2})/R(108(i)) \quad \text{Eq. 12}$$

In this regard, because the output voltage ($V_{OUT}$) of the amplifier 134 correlates to ($V_{AVG1}-V_{AVG2}$), the gain of the amplifier 134 can be calibrated to account for the effective resistance ($R_{eff}$) such that the output voltage ($V_{OUT}$) is proportional to the total current ($I_T$) flowing to the distributed load circuit 102. For example, the amplifier 134 can be calibrated such that the gain of the amplifier 134 corresponds to the effective resistance ($R_{eff}$). In particular, circuits may be employed on a semiconductor die on which the distributed load circuit 102 is disposed, wherein such circuits are configured to generate varying levels of the total current ($I_T$) during testing of the distributed load circuit 102. The varying levels of total current ($I_T$) can be used to calibrate the amplifier 134 (such as by burning corresponding fuses during testing) to capture per-part/per-package variation in corresponding resistances. In this manner, the calibration of the amplifier 134 can be self-contained to the corresponding chip/part, wherein no post-test calibration is needed. Further, because the output voltage ($V_{OUT}$) is proportional to the total current ($I_T$), a control circuit can use the output voltage ($V_{OUT}$) to adjust the frequency of various elements corresponding to the distributed load circuit 102 to prevent the total current ($I_T$) from exceeding a current threshold. In this manner, the current sense circuit 100 allows for sensing total current ($I_T$) independently of where the current flows, thus providing a more accurate measurement compared to sensing current in a particular area of the distributed load circuit 102. More accurate current sensing may improve function of a corresponding control circuit that uses the sensed current to reduce or avoid circuit failures caused by excessive current.

Figure 2:
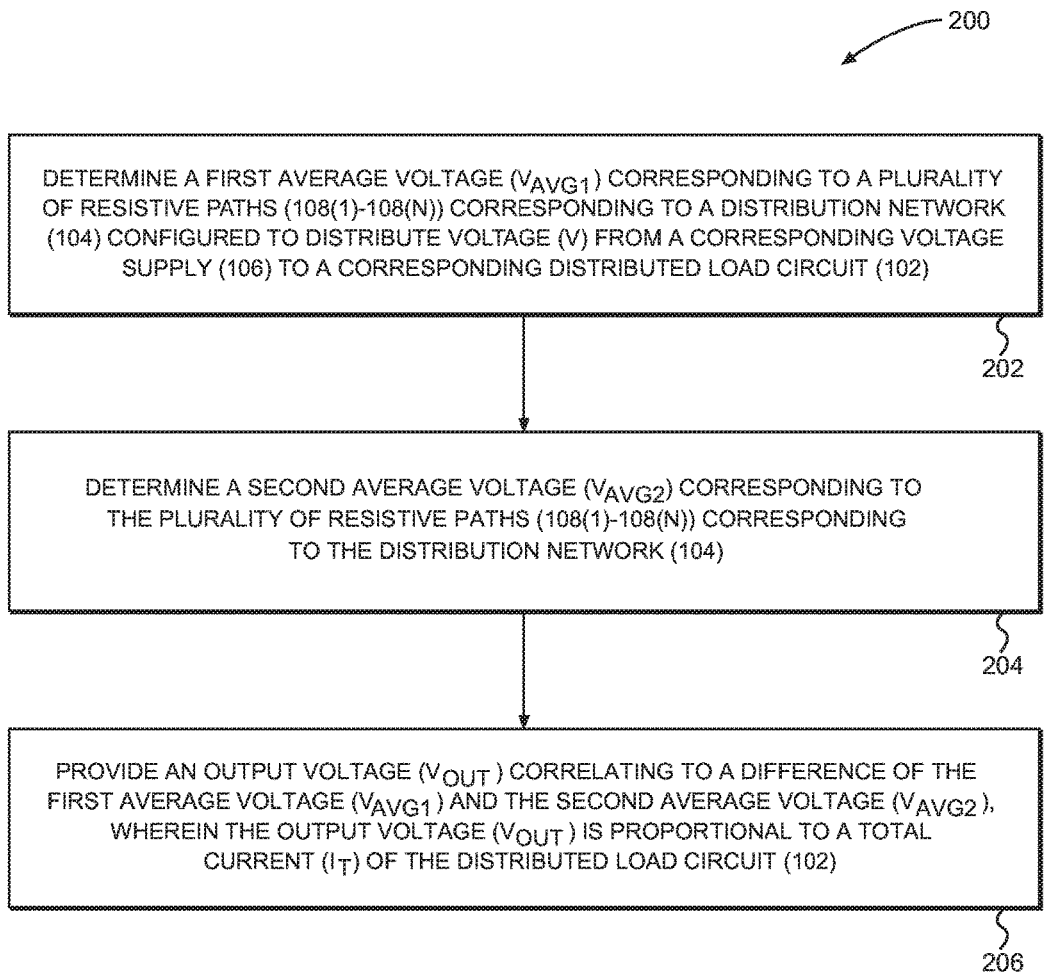
FIG. 2 is a flowchart illustrating an exemplary process that can be performed by the current sense circuit of FIG. 1 to sense the total current of the distributed load circuit independent of current distribution using distributed voltage averaging of voltages corresponding to the distribution network.

FIG. 2 illustrates an exemplary process 200 that can be performed by the current sense circuit 100 in FIG. 1 to sense the total current ($I_T$) of the distributed load circuit 102 independent of current distribution using distributed voltage averaging of voltages corresponding to the distribution network 104. In particular, the process 200 includes the first distributed voltage averaging circuit 112(1) determining the first average voltage ($V_{AVG1}$) corresponding to the resistive paths 108(1)-108(N) corresponding to the distribution network 104 (block 202). The process 200 also includes the second distributed voltage averaging circuit 112(2) determining the second average voltage ($V_{AVG2}$) corresponding to the resistive paths 108(1)-108(N) corresponding to the distribution network 104 (block 204). Further, the process 200 includes the amplifier 134 providing the output voltage ($V_{OUT}$) correlating to the difference of the first average voltage ($V_{AVG1}$) and the second average voltage ($V_{AVG2}$) (block 206). In particular, the output voltage ($V_{OUT}$) is proportional to the total current ($I_T$) of the distributed load circuit 102. As noted above, the gain of the amplifier 134 can be calibrated such that the output voltage ($V_{OUT}$) is proportional to the total current ($I_T$).

Figure 3A:
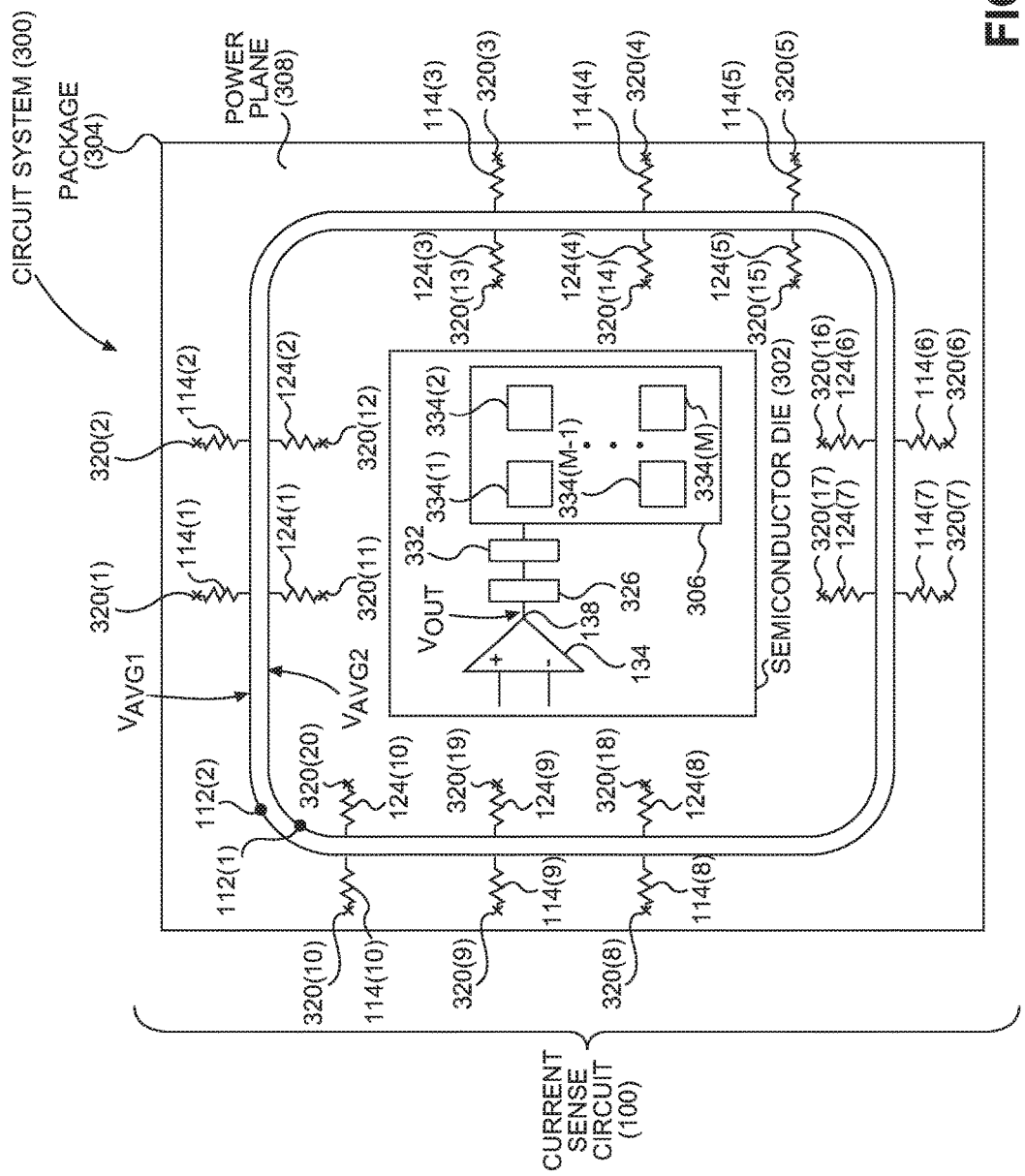
FIG. 3A is a top-view diagram of an exemplary circuit system employing a semiconductor die disposed on a package and including a distributed load circuit configured to receive voltage from a power plane in the package, wherein the circuit system also includes a current sense circuit configured to sense total current provided to the distributed load circuit based on resistive portions of the power plane.
Figure 3B:
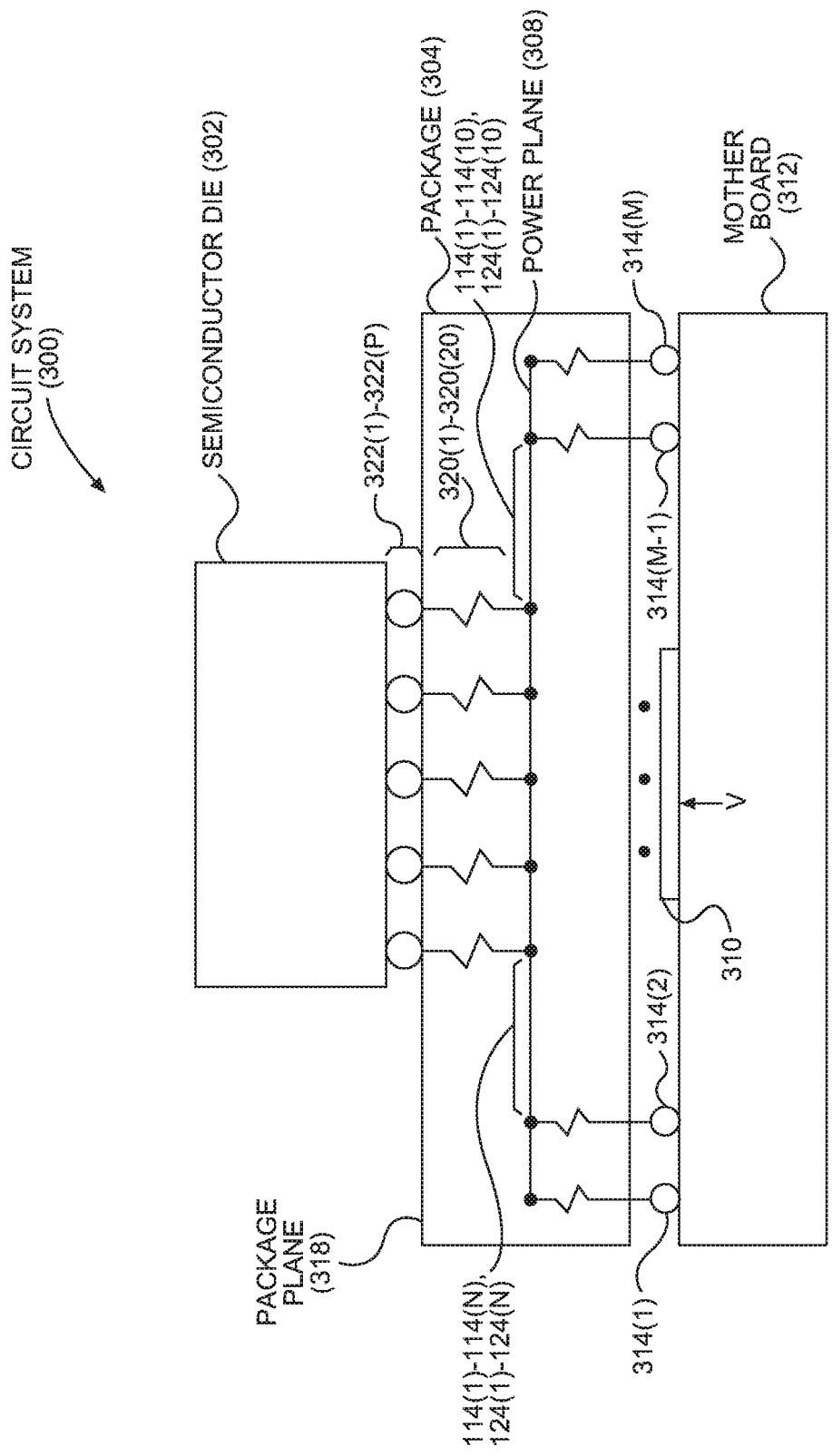
FIG. 3B is a side-view diagram of the circuit system of FIG. 3A that includes the current sense circuit configured to sense the total current provided to the distributed load circuit based on resistive portions of the power plane.
Figure 3C:
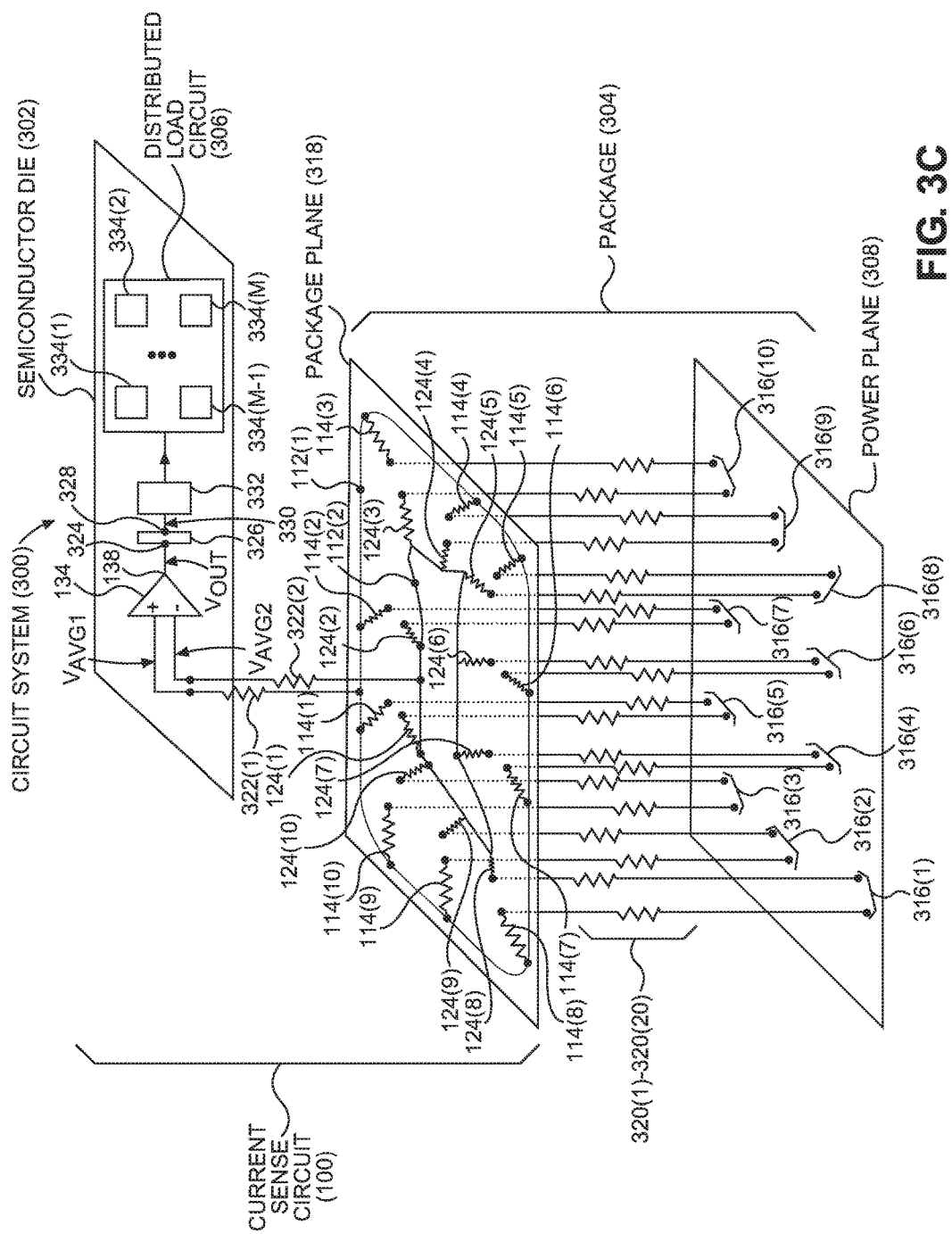
FIG. 3C is a perspective-view diagram of the circuit system of FIG. 3A that includes the current sense circuit configured to sense the total current provided to the distributed load circuit based on resistive portions of the power plane.

FIGS. 3A-3C illustrate an exemplary circuit system 300 employing a semiconductor die 302 disposed on a package 304, wherein the semiconductor die 302 includes a distributed load circuit 306 (also referred to integrated circuit (IC) 306) configured to receive voltage (V) from a power plane 308 (also referred to as a distribution network 308) disposed in the package 304. Common elements between FIGS. 1 and 3A-3C are shown with common element numbers and will not be re-described herein. As used herein, the package 304 is a case on which the semiconductor die 302 is disposed, and the power plane 308 is a planar sheet of conductive material, such as copper. In this aspect, the power plane 308 is configured to receive voltage (V) from a voltage supply 310 disposed on a motherboard 312 interconnected to the package 304 using solder balls 314(1)-314(M). With particular reference to FIG. 3C, voltage may be provided at any point around the perimeter of the power plane 308, wherein corresponding current flows from the perimeter to the center of the power plane 308. The circuit system 300 also includes the current sense circuit 100 of FIG. 1 configured to sense total current ($I_T$) provided to the distributed load circuit 306 by determining the output voltage ($V_{OUT}$) proportional to the total current ($I_T$) based on resistive paths 316(1)-316(10) of the power plane 308. In particular, the resistive paths 316(1)-316(10) in this aspect are resistive portions 316(1)-316(10) of the power plane 308, each of which has a corresponding parasitic resistance ($R_P$). In this manner, the current sense circuit 100 is configured to sense the total current ($I_T$) of the distributed load circuit 306 based on the parasitic resistance ($R_P$) of the resistive portions 316(1)-316(10) of the power plane 308. In other words, the total current ($I_T$) sensed is based on the load currents corresponding to the area encompassed by the resistive paths 316(1)-316(10). FIG. 3A illustrates a top view of the circuit system 300, while FIGS. 3B and 3C illustrate a side view a perspective view, respectively, of the circuit system 300. With particular reference to FIG. 3A, and as illustrated in FIGS. 3B-3C, it is important to note that the power plane 308 is on a separate level of the circuit system 300 than the current sense circuit 100.

With continuing reference to FIGS. 3A-3C, in this aspect the current sense circuit 100 is employed across the semiconductor die 302 and the package 304. More specifically, the amplifier 134 is disposed on the semiconductor die 302, while the first and second distributed voltage averaging circuits 112(1), 112(2) are disposed on a package plane 318 of the package 304. As used herein, the package plane 318 is a planar layer of the package 304. Other aspects may include the first and second distributed voltage averaging circuits 112(1), 112(2) disposed on the semiconductor die 302 instead of the package plane 318. Further, the package plane 318 is interconnected to the power plane 308 using vias 320(1)-320(20) such that the resistive circuits 114(1)-114(10), 124(1)-124(10) of the corresponding first and second distributed voltage averaging circuits 112(1), 112(2) are electrically coupled to the power plane 308. Interconnecting the resistive circuits 114(1)-114(10), 124(1)-124(10) to the power plane 308 in this manner allows the first and second distributed voltage averaging circuits 112(1), 112(2) to determine the first and second average voltages ($V_{AVG1}$), ($V_{AVG2}$) based on the parasitic resistance ($R_P$) of the resistive portions 316(1)-316(10) of the power plane 308. In this example, a resistance (R) of each via 320(1)-320(20) is small enough to be negligible compared to the parasitic resistance ($R_P$) of the resistive portions 316(1)-316(10) of the power plane 308. However, in other aspects, if the resistance of each via 320(1)-320(20) is non-negligible compared to the parasitic resistance ($R_P$) of the resistive portions 316(1)-316(10), the resistance (R) of the resistive circuits 114(1)-114(10), 124(1)-124(10) can be adjusted accordingly.

With continuing reference to FIGS. 3A-3C, the first and second average voltages ($V_{AVG1}$), ($V_{AVG2}$) are provided to the amplifier 134 across corresponding solder bumps 322(1)-322(P) that interconnect the package plane 318 and the semiconductor die 302. The solder bumps 322(1)-322(P) are illustrated in FIG. 3C as resistive elements 322(1), 322(2) for simplicity. In particular, it is worth noting that because the first and second distributed voltage averaging circuits 112(1), 112(2) are disposed on the package plane 318 in this aspect, the resistive elements 322(1), 322(2) are sufficient to describe providing the first and second average voltages ($V_{AVG1}$), ($V_{AVG2}$) to the semiconductor die 302 in FIG. 3C. However, in aspects that dispose the first and second distributed voltage averaging circuits 112(1), 112(2) on the semiconductor die 302, coupling the first and second distributed voltage averaging circuits 112(1), 112(2) to the power plane 308 using solder bumps 322(1)-322(P) is the preferred configuration.

With continuing reference to FIGS. 3A-3C, as previously described, the output node 138 of the amplifier 134 has the output voltage ($V_{OUT}$) that is proportional to the total current ($I_T$) of the distributed load circuit 306. In this manner, the output node 138 is electrically coupled to an input node 324 of an analog-to-digital converter (ADC) 326 such that the output voltage ($V_{OUT}$) is provided to the ADC 326, wherein an output node 328 of the ADC 326 has a digital signal 330 that is a digital representation of the output voltage ($V_{OUT}$).

It is worth noting that the output node 328 may include output nodes 328(1)-328(X), wherein X is a number of bits of the digital signal 330. A control circuit 332 is configured to receive the digital signal 330. In response to the digital signal 330 exceeding a defined threshold value, the control circuit 332 is configured to adjust one or more parameters of one or more circuits 334(1)-334(M) of the distributed load circuit 306 operate such that the total current ($I_T$) is less than or equal to a maximum current level ($I_{MAX}$). As a non-limiting example, the distributed load circuit 306 may be a multiprocessor circuit and the circuits 334(1)-334(M) may be processor core circuits disposed in the multiprocessor circuit, and the control circuit 332 may adjust the parameters (e.g., frequency) of the circuits 334(1)-334(M) to reduce the total current ($I_T$). In this manner, the current sense circuit 100 provides a more accurate measurement of total current ($I_T$) compared to sensing current in a particular area of the distributed load circuit 306 as described above, which improves the function of the control circuit 332 to reduce or avoid circuit failures caused by excessive current.

While the current sense circuit 100 employed in the circuit system 300 of FIG. 3 is configured to sense the total current ($I_T$) based on the ten (10) resistive portions 316(1)-316(10) of the power plane 308, other aspects may sense the total current ($I_T$) based on any number (N) of resistive portions of a power plane. However, the number and location of such resistive portions affects the accuracy of the sensed total current ($I_T$).

Figure 4:
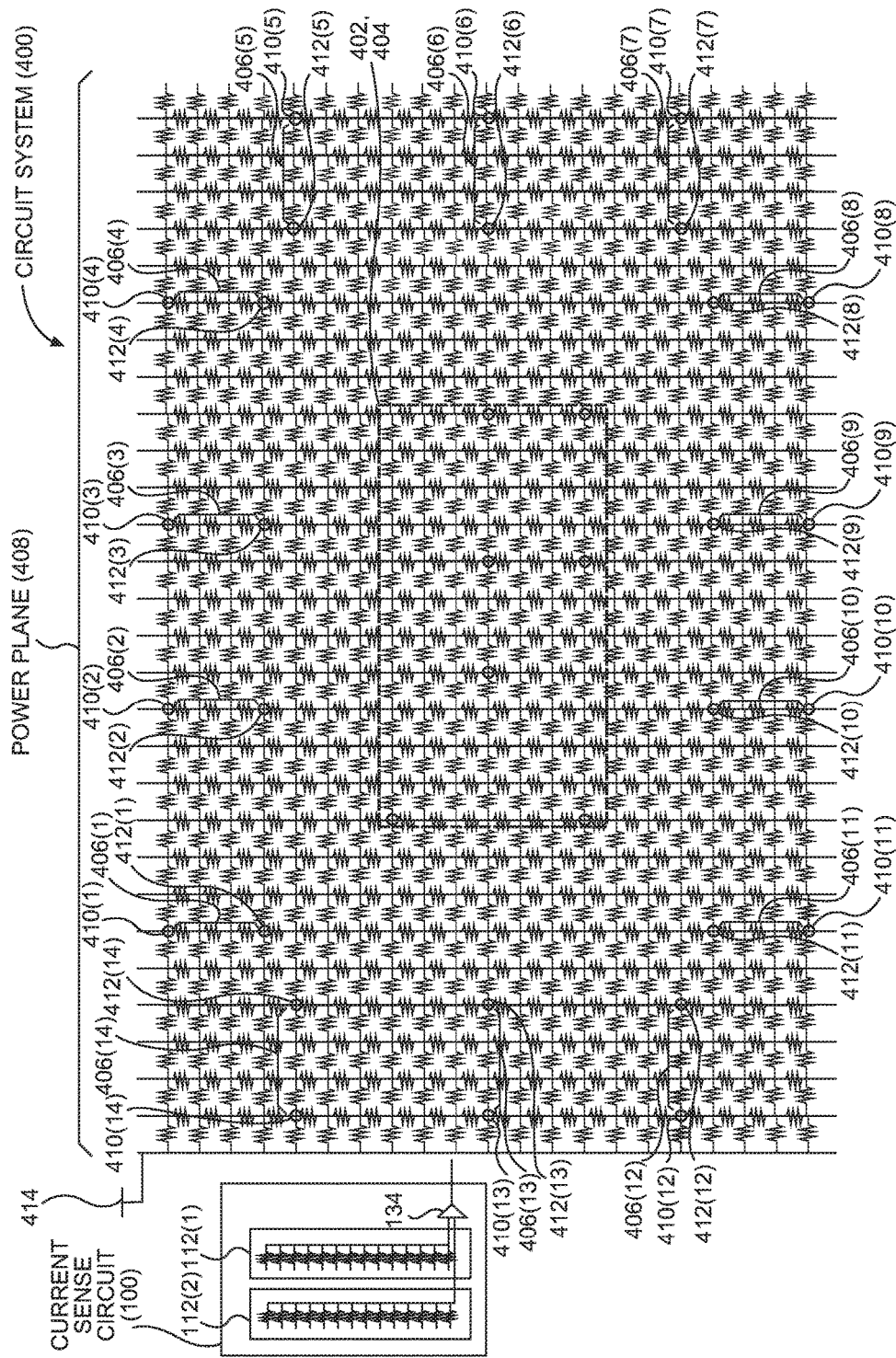
FIG. 4 is circuit diagram of an exemplary resistive model that includes a current sense circuit configured to sense total current provided to a distributed load circuit of a semiconductor die based on resistive portions of a power plane.

In this regard, FIG. 4 illustrates an exemplary resistive model 400 that includes the current sense circuit 100 of FIG. 1 configured to sense total current ($I_T$) provided to a distributed load circuit 402 of a semiconductor die 404 based on resistive portions 406(1)-406(14) of a power plane 408. In other words, the power plane 408 functions as a distribution network to the distributed load circuit 402 of the semiconductor die 404. More specifically, the first distributed voltage averaging circuit 112(1) is electrically coupled to nodes 410(1)-410(14) of the power plane 408 such that the first average voltage ($V_{AVG1}$) is determined based on a voltage (V) of each node 410(1)-410(14) and a parasitic resistance ($R_P$) of each corresponding resistive portion 406(1)-406(14). Further, the second distributed voltage averaging circuit 112(2) is electrically coupled to nodes 412(1)-412(14) of the power plane 408 such that the second average voltage ($V_{AVG2}$) is determined based on a voltage (V) of each node 412(1)-412(14) and a parasitic resistance ($R_P$) of each corresponding resistive portion 406(1)-406(14). In this manner, the output voltage ($V_{OUT}$), and thus the sensed total current ($I_T$), is determined based on a parasitic resistance ($R_P$) of the resistive portions 406(1)-406(14), as well as the current density corresponding to the path formed by the resistive portions 406(1)-406(14). It is worth noting that a voltage supply 414 provides voltage to one side of the power plane 408 in this example. However, other aspects may be configured such that one or more instances of the voltage supply 414 provides voltage to one or more various points of the power plane 408. More specifically, the voltage supply 414 can be configured to provide voltage to one or multiple sides of the power plane 408, wherein the current density profile (e.g., current distribution) is dependent on the locations of such voltage points. However, regardless of the orientation of voltage supply, the output voltage ($V_{OUT}$) provides an accurate estimate of the total current ($I_T$) for the reasons previously described. Additionally, although this example includes pairs of corresponding nodes 410(1)-410(14), 412(1)-412(14), other aspects may employ the first and second distributed voltage averaging circuits 112(1), 112(2) without pairing the nodes 410(1)-410(14), 412(1)-412(14).

Figure 5:
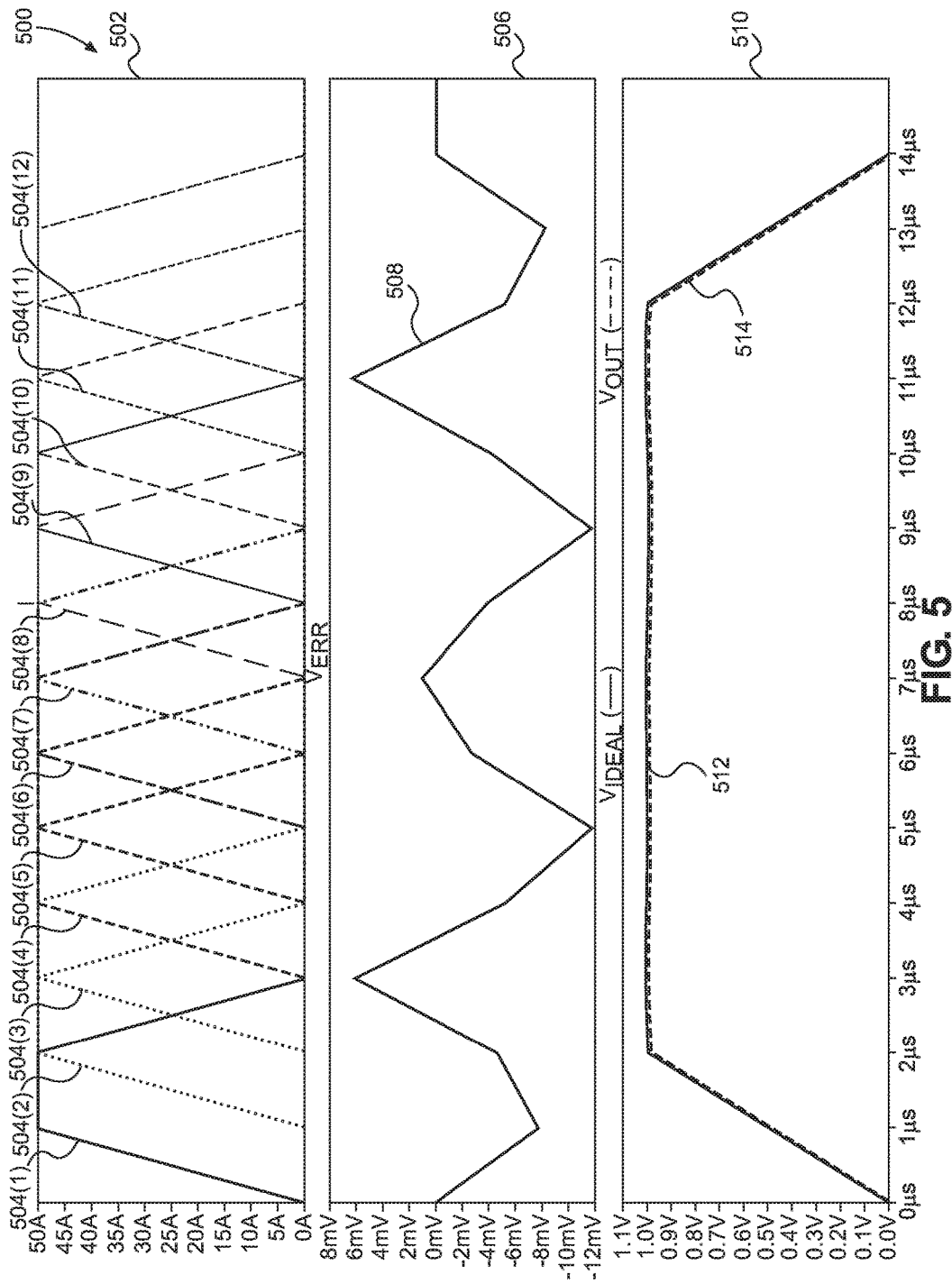
FIG. 5 is a graph illustrating an exemplary set of signals corresponding to the total current sensed based on average voltages determined across multiple resistive portions of the power plane in the resistive model of FIG. 4.

FIG. 5 is a graph 500 illustrating an exemplary set of signals corresponding to the total current ($I_T$) sensed based on first and second average voltages ($V_{AVG1}$), ($V_{AVG2}$) determined across the resistive portions 406(1)-406(14) of the power plane 408 in the resistive model 400 of FIG. 4. More specifically, the set of signals illustrates the output voltage ($V_{OUT}$) determined versus an ideal voltage ($V_{IDEAL}$) over an amount of time equal to fourteen (14) microseconds (µs). In this manner, box 502 of the graph 500 includes lines 504(1)-504(12) illustrating a current (I) draw from spatial regions corresponding to the distributed load circuit 402 in FIG. 4. Further, box 506 includes a line 508 illustrating an error voltage ($V_{ERR}$) illustrating that the difference between the output voltage ($V_{OUT}$) and the ideal voltage ($V_{IDEAL}$) is within a range of −12 millivolts (mV) and +8 mV. In other words, the total current ($I_T$) sensed using the current sense circuit 100 in FIG. 4 is within an error rate of −1.2% and +0.8% of the current (I) determined based on the ideal voltage ($V_{IDEAL}$). Such a relatively small error rate is also evidenced in box 510, which illustrates that a line 512 representing the ideal voltage ($V_{IDEAL}$) versus a line 514 representing the output voltage ($V_{OUT}$) are approximately equal over the course of the fourteen (14) ns sensing period. It is worth noting that although the aspects discussed above sense the total current ($I_T$) based on parasitic resistances of a power plane, other aspects may be configured to sense the total current ($I_T$) based on similar measurements made with respect to a ground plane.

Figure 6:
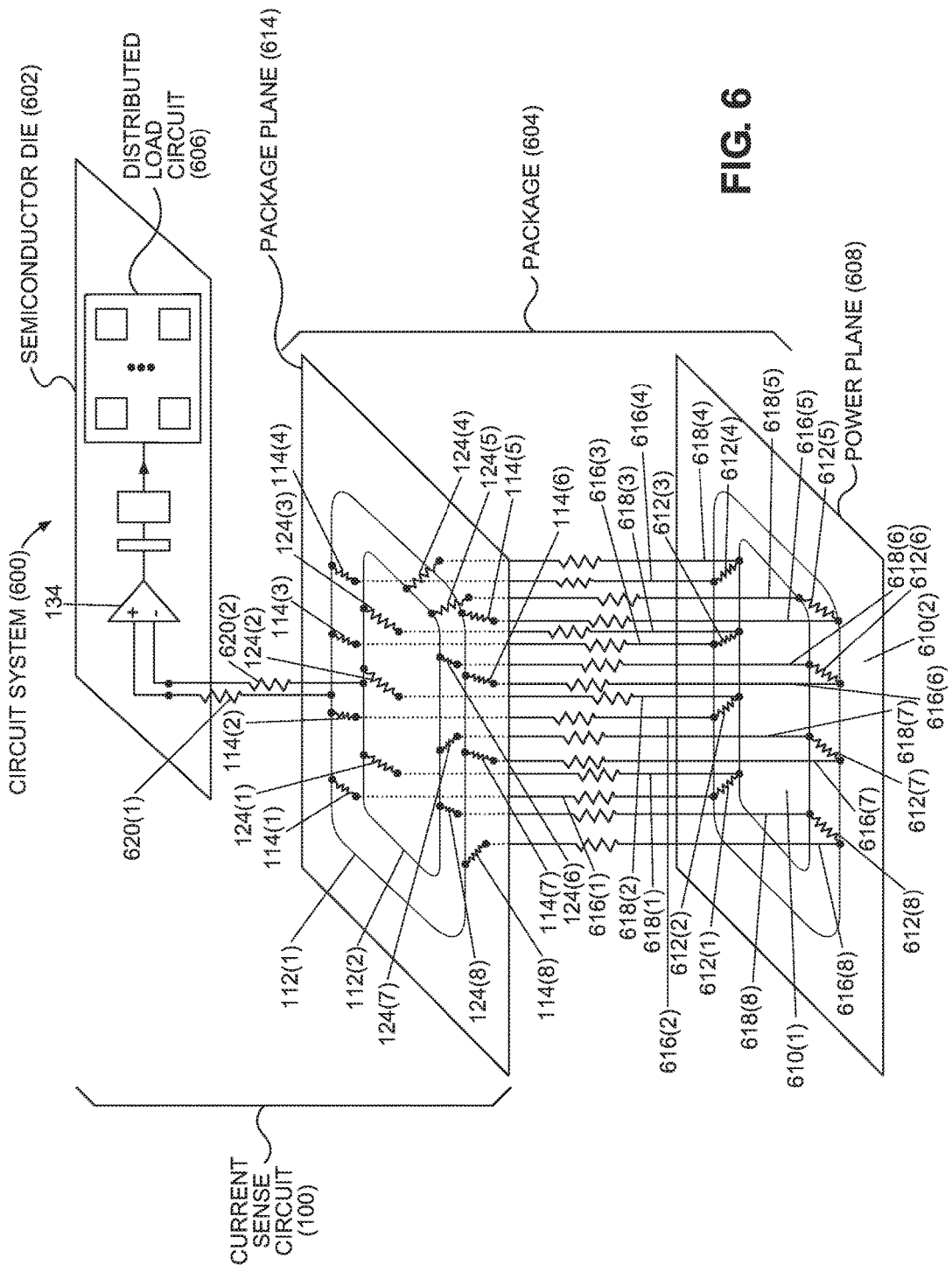
FIG. 6 is a perspective-view diagram of an exemplary circuit system employing a semiconductor die disposed on a package and including a distributed load circuit configured to receive voltage from a power plane in the package, wherein the circuit system also includes a current sense circuit configured to sense total current provided to the distributed load circuit based on discrete resistors disposed in the package and corresponding to the power plane.

In addition to sensing the total current ($I_T$) based on the parasitic resistance ($R_P$) of resistive portions of a power plane as discussed with reference to FIGS. 3A-3C, the total current ($I_T$) may be sensed using other elements of a distribution network related to a power plane. In this regard, FIG. 6 illustrates a perspective-view diagram of an exemplary circuit system 600 employing a semiconductor die 602 disposed on a package 604 and including a distributed load circuit 606 (also referred to as IC 606) configured to receive voltage (V) from a power plane 608 (also referred to as distribution network 608) in the package 604. Common elements between FIGS. 1 and 6 are shown with common element numbers and will not be re-described herein. The power plane 608 is divided into an inner portion 610(1) and an outer portion 610(2), wherein resistive paths 612(1)-612(8) (e.g., resistors 612(1)-612(8)) electrically coupled the inner and outer portions 610(1), 610(2). In this manner, voltage may be provided to one or more points around the perimeter of the power plane 608, wherein corresponding current flows from the perimeter (i.e., the outer portion 610(2)) to the center of the power plane 608 (i.e., the inner portion 610(1)).

With continuing reference to FIG. 6, the circuit system 600 also includes the current sense circuit 100 of FIG. 1 employing the first and second distributed voltage averaging circuits 112(1), 112(2) that include the resistive circuits 114(1)-114(8) and 124(1)-124(8), respectively disposed on a package plane 614. The current sense circuit 100 is configured to sense total current ($I_T$) provided to the distributed load circuit 606 by determining the output voltage ($V_{OUT}$) proportional to the total current ($I_T$). However, unlike the circuit system 300 in FIGS. 3A-3C that measures current based on the resistive paths 316(1)-316(10) which are resistive portions 316(1)-316(10) of the power plane 308, the resistive paths 612(1)-612(8) in this aspect are discrete resistors 612(1)-612(8) as described above. In this manner, a via 616(1)-616(8) electrically couples each corresponding resistive path 612(1)-612(8) to a corresponding resistive circuit 114(1)-114(6) of the first distributed voltage averaging circuit 112(1). Additionally, a via 618(1)-618(8) electrically couples each corresponding resistive path 612(1)-612(8) to a corresponding resistive circuit 124(1)-124(6) of the second distributed voltage averaging circuit 112(2). Additionally, resistive elements 620(1), 620(2) represent solder bumps 620(1)-620(S) used to interconnect the package plane 614 to the semiconductor die 602. In this manner, the current sense circuit 100 is configured to sense the total current ($I_T$) of the distributed load circuit 606 based on a resistance (R) of each resistor 612(1)-612(8). It is worth noting that while the first and second distributed voltage averaging circuits 112(1), 112(2) are disposed on the package plane 614 in this aspect, other aspects may include the first and second distributed voltage averaging circuits 112(1), 112(2) disposed on the semiconductor die 602.

Figure 7:
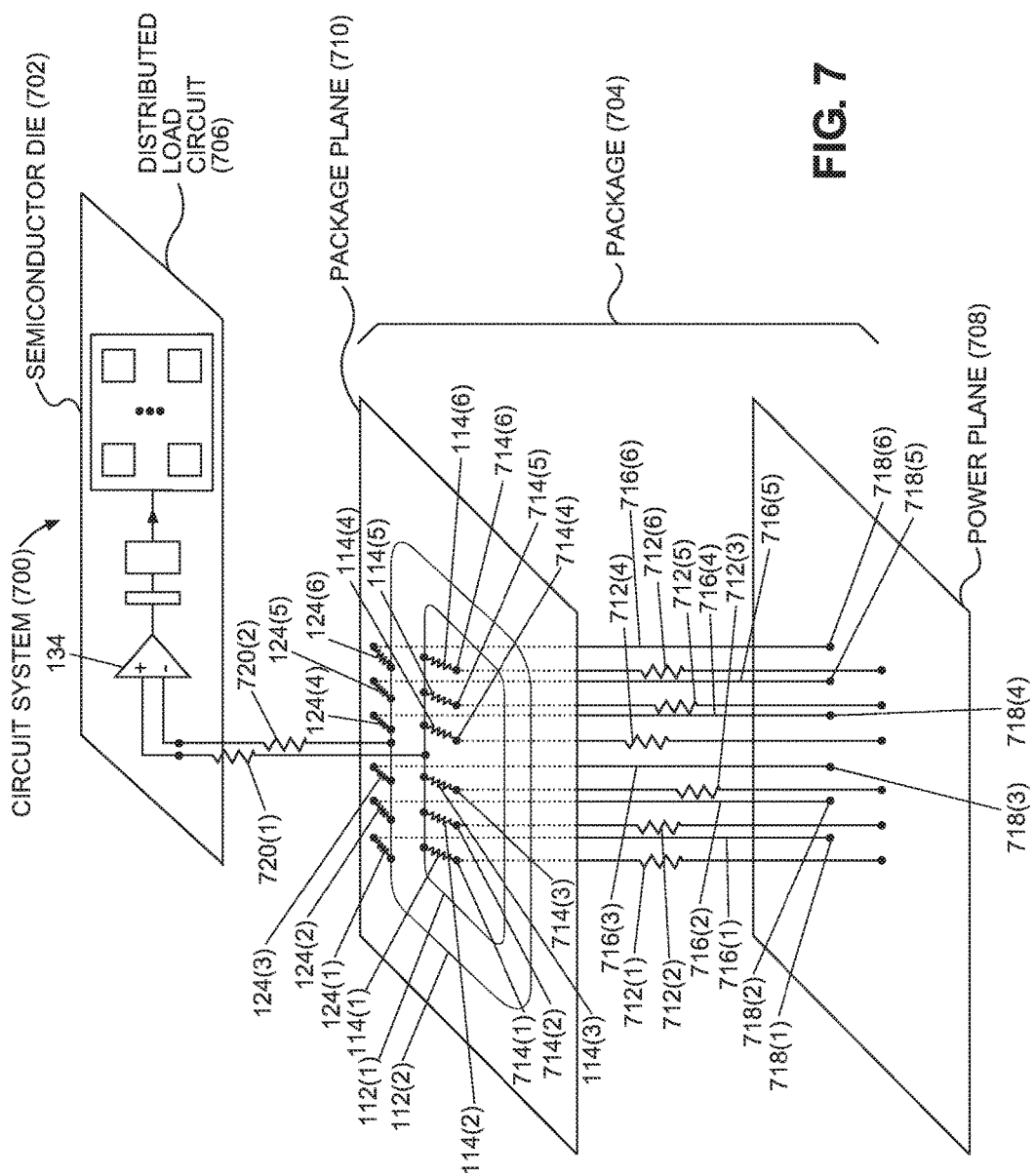
FIG. 7 is a perspective-view diagram of an exemplary circuit system employing a semiconductor die disposed on a package and including a distributed load circuit configured to receive voltage from a power plane in the package, wherein the circuit system also includes a current sense circuit configured to sense total current provided to the distributed load circuit based on resistances of vertical interconnect accesses (vias) corresponding to the power plane.

Additionally, FIG. 7 illustrates a perspective-view diagram of an exemplary circuit system 700 employing a semiconductor die 702 disposed on a package 704 and including a distributed load circuit 706 (also referred to as IC 706) configured to receive voltage (V) from a power plane 708 (also referred to as distribution network 708) in the package 704. Common elements between FIGS. 1 and 7 are shown with common element numbers and will not be re-described herein. In this manner, voltage may be provided at one or more points around the perimeter of the power plane 708, wherein corresponding current flows from the perimeter to the center of the power plane 708. Further, the circuit system 700 also includes the current sense circuit 100 of FIG. 1 employing the first and second distributed voltage averaging circuits 112(1), 112(2) that include the resistive circuits 114(1)-114(6) and 124(1)-124(6), respectively, disposed on a package plane 710. In this aspect, the current sense circuit 100 is configured to sense total current ($I_T$) provided to the distributed load circuit 706 based on resistances (R) of resistive paths 712(1)-712(6), wherein the resistive paths 712(1)-712(6) are vias 712(1)-712(6) interconnecting the power plane 708 and the package plane 710 of the package 704. In particular, because current flows to the center of the power plane 708, current flows from the power plane 708 to the package plane 710 by way of the vias 712(1)-712(6). Further, a first node 714(1)-714(6) of each corresponding via 712(1)-712(6) is electrically coupled to a corresponding resistive circuit 114(1)-114(6) of the first distributed voltage averaging circuit 112(1). Additionally, a sense line 716(1)-716(6) corresponding to a second node 718(1)-718(6) of each corresponding via 712(1)-712(6) is electrically coupled to a corresponding resistive circuit 124(1)-124(6) of the second distributed voltage averaging circuit 112(2). Resistive elements 720(1), 720(2) represent solder bumps 720(1)-720(S) used to interconnect the package plane 710 to the semiconductor die 702, wherein the voltage (V) is delivered from the center area of the package plane 710 corresponding to the first nodes 714(1)-714(6) to the distributed load circuit 706. Using the configuration described in FIG. 7, the current sense circuit 100 is configured to sense the total current ($I_T$) of the distributed load circuit 706 based on a resistance (R) of each via 712(1)-712(6).

Figure 8:
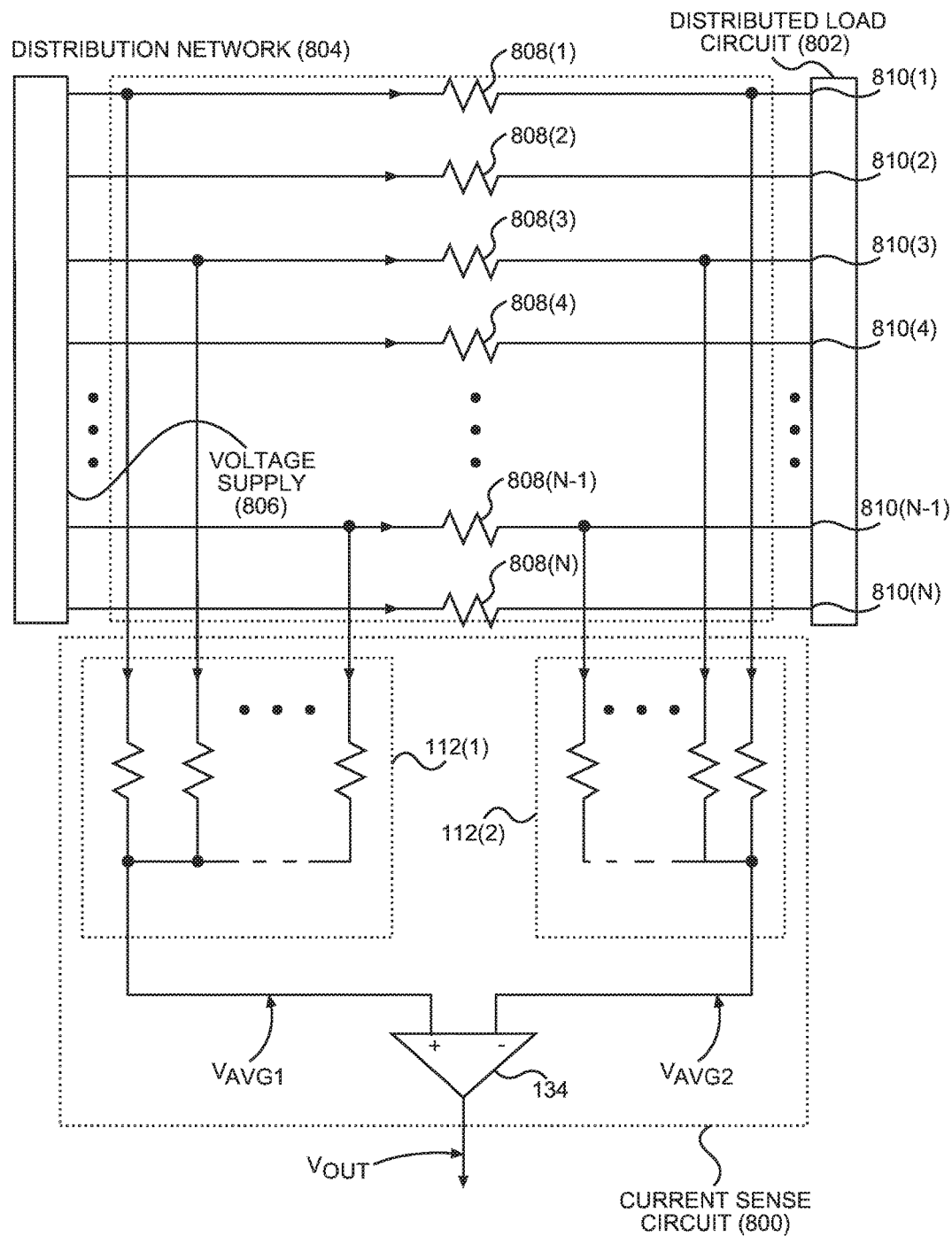
FIG. 8 is a circuit diagram of another exemplary current sense circuit configured to sense total current of a distributed load circuit using distributed voltage averaging of selected voltages of a distribution network configured to distribute voltage from a voltage supply to the distributed load circuit.

In addition to the current sense circuit 100 in FIG. 1, other aspects of the current sense resistor may sense the total current ($I_T$) of a distributed load circuit based on selected resistive paths of a distribution network. In this regard, FIG. 8 illustrates an exemplary current sense circuit 800 configured to sense total current ($I_T$) of a distributed load circuit 802 independent of current distribution using distributed voltage averaging of selected voltages corresponding to a distribution network 804 configured to distribute voltage (V) from a voltage supply 806 to the distributed load circuit 802. Common elements between FIGS. 1 and 8 are shown with common element numbers and will not be re-described herein. In particular, a voltage (V) of the voltage supply 806 is distributed across resistive paths 808(1)-808(N) of the distribution network 804 to the distributed load circuit 802. In this example, each resistive path 808(1)-808(N) has a corresponding resistance (R) and is electrically coupled to a corresponding load node 810(1)-810(N) of the distributed load circuit 802. Although not illustrated in FIG. 8, each length of wire that electrically couples the voltage supply 806 and the resistive paths 808(1)-808(N), as well as each length of wire that electrically couples the distributed load circuit 802 and the resistive paths 808(1)-808(N), has a parasitic resistance that is negligible to the calculations discussed herein. The current sense circuit 800 includes the first and second distributed voltage averaging circuits 112(1), 112(2) described previously in FIG. 1 configured to tap voltages of the distribution network 804 to determine the average voltages ($V_{AVG1}$), ($V_{AVG2}$), respectively, of the distributed load circuit 802. However, rather than using each resistive path 808(1)-808(N), the average voltages ($V_{AVG1}$), ($V_{AVG2}$) are each determined based on voltages (V) of an M number of selected resistive paths 808(1), 808(3) . . . 808(N−1), wherein K is the number of non-selected resistive paths 808(2), 808(4) . . . 808(N). In this manner, if each resistive path 808(1)-808(N) has a substantially equal resistance (R), then the total current ($I_T$) can be expressed by Equation 13:

$$I_T = (V_{AVG1} - V_{AVG2})/(R/(M+K)) \qquad \text{Eq. 13}$$

It is worth noting that Equation 13 can be used to calculate the total current ($I_T$) using the M number of resistive paths 808($i$) in instances wherein the resistance (R($i$)) of the resistive circuits 114(1)-114(N), 124(1)-124(N) are either equal (i.e., non-weighted) or unequal (i.e., weighted), as discussed above with reference to Equations 1-11.

The elements described herein are sometimes referred to as means for performing particular functions. In this regard, the first distributed voltage averaging circuit 112(1) illustrated in FIG. 1 is an example of "a means for determining a first average voltage corresponding to a plurality of resistive paths corresponding to a distribution network configured to distribute voltage from a corresponding voltage supply to a corresponding distributed load circuit." The second distributed voltage averaging circuit 112(2) illustrated in FIG. 1 is an example of "a means for determining a second average voltage corresponding to a plurality of resistive paths corresponding to the distributed network." The amplifier 134 illustrated in FIG. 1 is an example of "a means for providing an output voltage correlating to a difference of the first average voltage and the second average voltage, wherein the output voltage is proportional to a total current of the distributed load circuit."

Sensing total current of distributed load circuits independent of current distribution using distributed voltage averaging according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
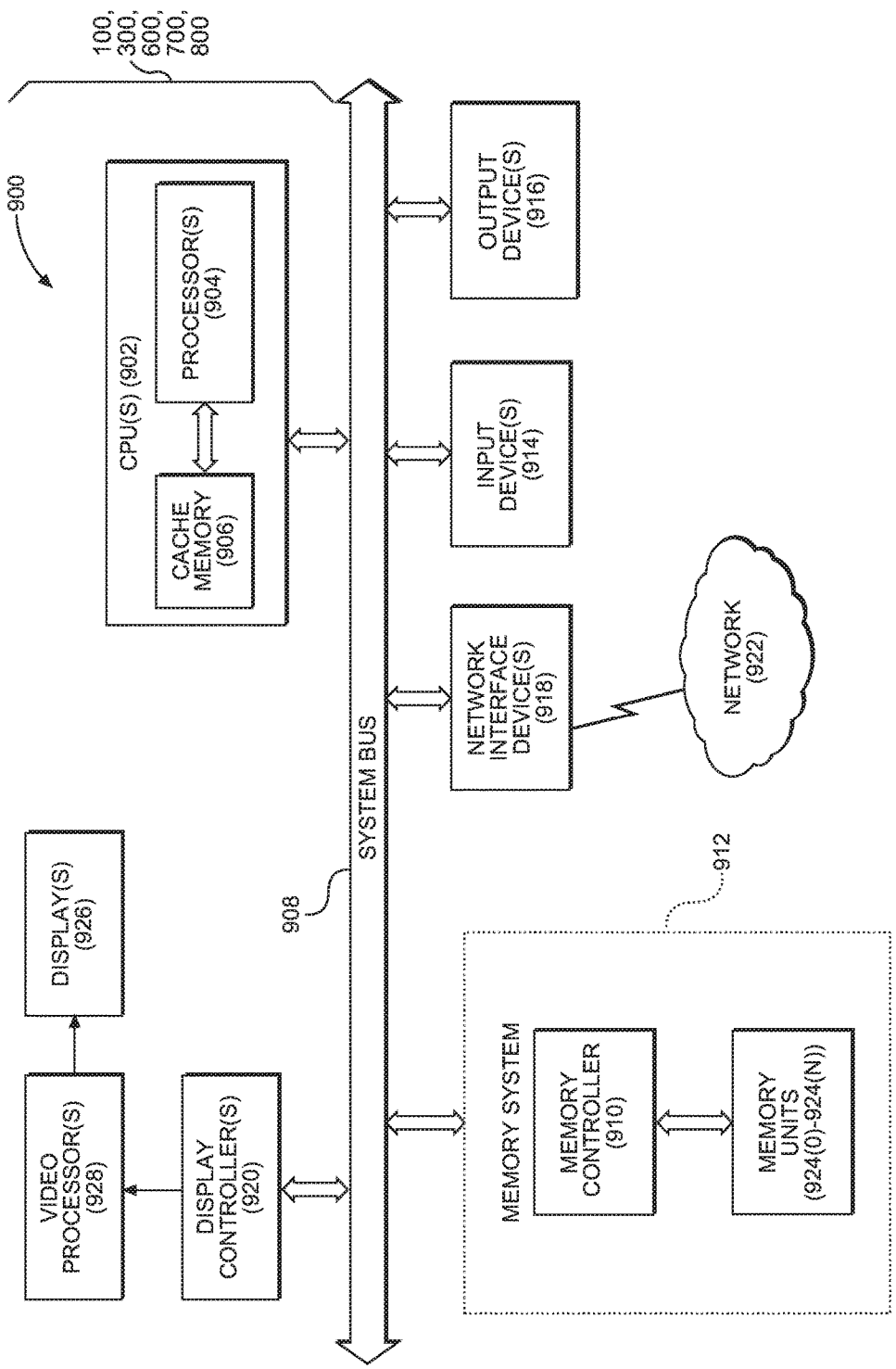
FIG. 9 is a block diagram of an exemplary processor-based system that can include elements employing the current sense circuits of FIGS. 1 and 8 configured to sense total current of a distributed load circuit independent of current distribution using distributed voltage averaging of voltages corresponding to a distribution network configured to distribute voltage to the distributed load circuit, as well as the circuit systems of FIGS. 3A-3C, 6, and 7.

In this regard, FIG. 9 illustrates an example of a processor-based system 900 that can include elements employing the current sense circuits 100, 800 of FIGS. 1 and 8, respectively, configured to sense total current of a distributed load circuit independent of current distribution using distributed voltage averaging of voltages corresponding to a distribution network configured to distribute voltage to the distributed load circuit. The processor-based system 900 that can also include elements employing the circuit systems 300, 600, and 700 of FIGS. 3A-3C, 6, and 7, respectively. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 912, one or more input devices 914, one or more output devices 916, one or more network interface devices 918, and one or more display controllers 920, as examples. The input device(s) 914 can include any type of input device, including, but not limited to, input keys, switches, voice processors, etc. The output device(s) 916 can include any type of output device, including, but not limited to, audio, video, other visual indicators, etc. The network interface device(s) 918 can be any device configured to allow exchange of data to and from a network 922. The network 922 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 918 can be configured to support any type of communications protocol desired. The memory system 912 can include one or more memory units 924(0)-924(N).

The CPU(s) 902 may also be configured to access the display controller(s) 920 over the system bus 908 to control information sent to one or more displays 926. The display controller(s) 920 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Figure 10:
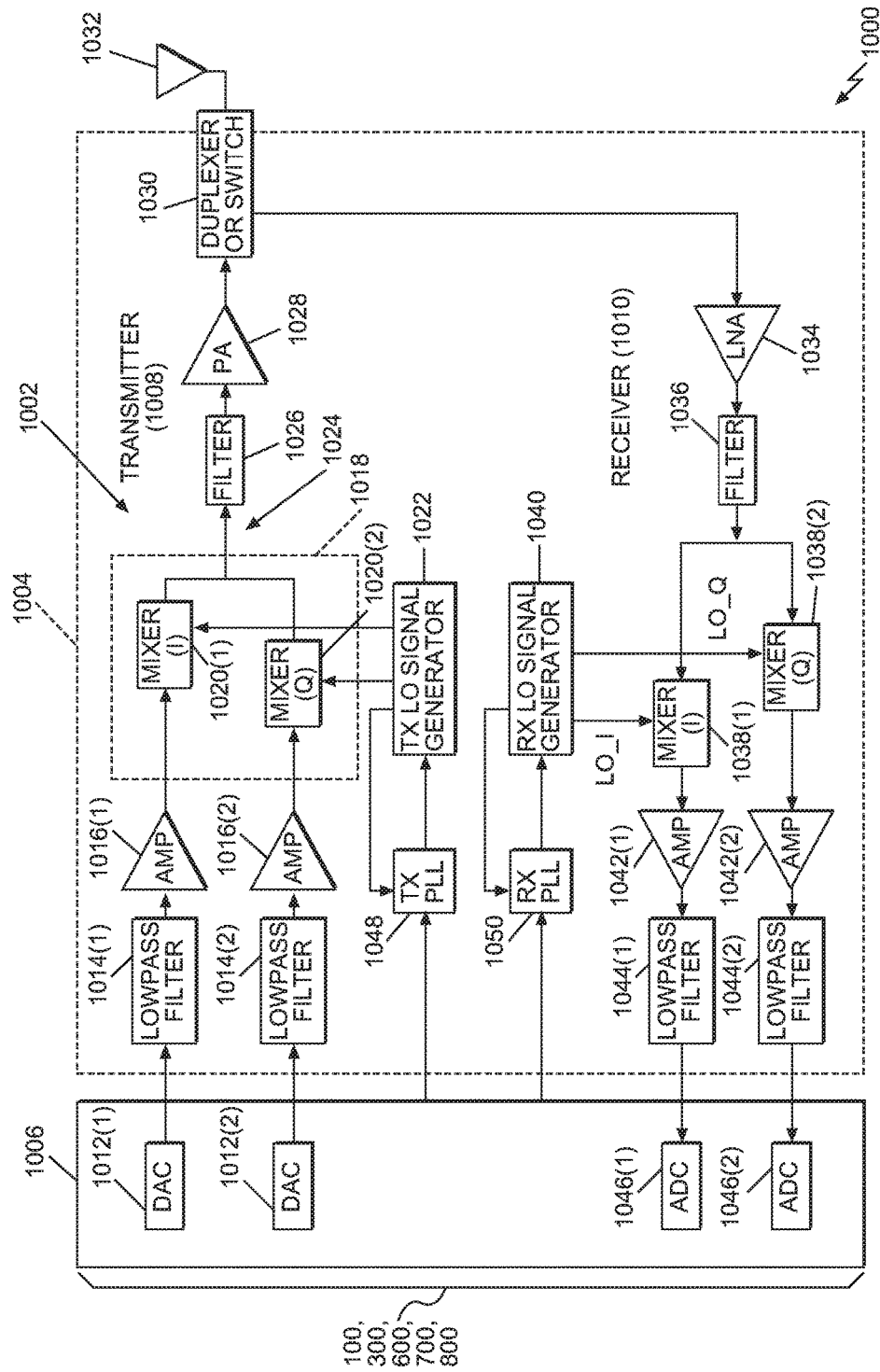
FIG. 10 is a block diagram of an exemplary wireless communications device that can include radio-frequency (RF) components formed in an integrated circuit (IC), wherein the RF components can include the current sense circuits of FIGS. 1 and 8 configured to sense total current of a distributed load circuit independent of current distribution using distributed voltage averaging of voltages corresponding to a distribution network configured to distribute voltage to the distributed load circuit, as well as the circuit systems of FIGS. 3A-3C, 6, and 7.

FIG. 10 illustrates an example of a wireless communications device 1000 that can include radio-frequency (RF) components that include the current sense circuits 100, 800 of FIGS. 1 and 8, respectively, configured to sense total current of a distributed load circuit independent of current distribution using distributed voltage averaging of voltages corresponding to a distribution network configured to distribute voltage to the distributed load circuit. The RF components can also include the circuit systems 300, 600, and 700 of FIGS. 3A-3C, 6, and 7, respectively. In this regard, the wireless communications device 1000 may be provided in an integrated circuit (IC) 1002. The wireless communications device 1000 may include or be provided in any of the above referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communication. In general, the wireless communications device 1000 may include any number of transmitters and/or receivers for any number of communication systems and frequency bands. All or a portion of the transceiver 1004 may be implemented on one or more analog ICs, RF ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog-converters (DACs) 1012(1), 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMP) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Down-conversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by amplifiers (AMP) 1042(1), 1042(2) and further filtered by lowpass filters 1044(1), 1044(2) to obtain I and Q analog input signals, which are provided to the data processor 1006. In this example, the data processor 1006 includes analog-to-digital-converters (ADCs) 1046(1), 1046(2) for converting the I and Q analog input signals into digital signals to be further processed by the data processor 1006.

In the wireless communications device 1000 in FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, a RX phase-locked loop (PLL) circuit 1050 receives timing information from the data processor 1006 and generates a control signal used to adjust the frequency and/or phase of the RX LO signals from the RX LO signal generator 1040.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A circuit system for sensing a current of a distributed load circuit, comprising:
   a distribution network comprising a plurality of resistive paths; and
   a current sense circuit, comprising:
   a first distributed voltage averaging circuit, comprising:
   a plurality of resistive circuits, wherein each resistive circuit of the plurality of resistive circuits comprises:
   an input node configured to be electrically coupled to a path node of a corresponding resistive path of the plurality of resistive paths corresponding to the distribution network configured to distribute voltage from a corresponding voltage supply to a corresponding distributed load circuit;
   an output node; and the input nodes of the plurality of resistive circuits coupled to the path nodes of the corresponding resistive paths electrically independent of each other; and a first voltage output node electrically coupled to the output node of each resistive circuit of the first distributed voltage averaging circuit and having a first average voltage of the distributed load circuit;

a second distributed voltage averaging circuit, comprising:
a plurality of resistive circuits, wherein each resistive circuit of the plurality of resistive circuits comprises:
an input node electrically coupled to a path node of a corresponding resistive path of the plurality of resistive paths corresponding to the distribution network;
an output node; and
the input nodes of the plurality of resistive circuits coupled to the path nodes of the corresponding resistive paths electrically independent of each other; and
a second voltage output node electrically coupled to the output node of each resistive circuit of the second distributed voltage averaging circuit and having a second average voltage of the distributed load circuit; and an amplifier comprising:
a first input node electrically coupled to the first voltage output node;
a second input node electrically coupled to the second voltage output node; and
an output node;
the amplifier configured to:
provide an output voltage on the output node of the amplifier proportional to a total current of the distributed load circuit; and
have a gain that corresponds to an effective resistance of the plurality of resistive paths;
wherein:
the distribution network comprises a power plane; and
each resistive path among the plurality of resistive paths comprises a resistive portion of the power plane.

2. The circuit system of claim 1, wherein:
each resistive circuit among the plurality of resistive circuits of the first distributed voltage averaging circuit further comprises at least one resistor; and
each resistive circuit among the plurality of resistive circuits of the second distributed voltage averaging circuit further comprises at least one resistor.

3. The circuit system of claim 1, wherein:
the distribution network further comprises the power plane disposed in a package; and
each resistive path among the plurality of resistive paths further comprises a resistor disposed in the package.

4. The circuit system of claim 1, wherein:
the distribution network further comprises:
a package plane electrically coupled to the distributed load circuit; and
a plurality of vertical interconnect accesses (vias) that interconnect the power plane and the package plane; and
each resistive path among the plurality of resistive paths further comprises a via of the plurality of vias.

5. The circuit system of claim 1, wherein each resistive path among the plurality of resistive paths has a substantially equal resistance.

6. The circuit system of claim 1, wherein at least one resistive path among the plurality of resistive paths has a resistance that is neither equal nor substantially equal to a resistance of the remaining resistive paths.

7. The circuit system of claim 1, wherein:
the input node of each resistive circuit of the first distributed voltage averaging circuit is electrically coupled to a node of a corresponding resistive path of the plurality of resistive paths; and
the input node of each resistive circuit of the second distributed voltage averaging circuit is electrically coupled to another node of the corresponding resistive path of the plurality of resistive paths.

8. The circuit system of claim 1, wherein:
the input node of each resistive circuit of the first distributed voltage averaging circuit is electrically coupled to a node of a corresponding resistive path of the plurality of resistive paths; and
the input node of each resistive circuit of the second distributed voltage averaging circuit is electrically coupled to a node of a corresponding resistive path of the plurality of resistive paths that is not electrically coupled to the first distributed voltage averaging circuit.

9. The circuit system of claim 1 integrated into an integrated circuit (IC).

10. The circuit system of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A circuit system for sensing a current of a distributed load circuit, comprising:
a means for distributing voltage from a voltage supply to a distributed load circuit, comprising a plurality of resistive paths;
a means for determining a first average voltage of a voltage at each of a plurality of first path nodes that are electrically independent of each other, wherein each first path node of the plurality of first path nodes corresponds to a resistive path of the plurality of resistive paths corresponding to the means for distributing voltage from the voltage supply to the distributed load circuit;
a means for determining a second average voltage of a voltage at each of a plurality of second path nodes that are electrically independent of each other, wherein each second path node of the plurality of second path nodes corresponds to a resistive path of the plurality of resistive paths corresponding to the means for distributing voltage from the voltage supply to the distributed load circuit; and
a means for providing an output voltage correlating to a difference of the first average voltage and the second average voltage, wherein the output voltage is proportional to a total current of the distributed load circuit, and the means for providing the output voltage correlating to the difference of the first average voltage and the second average voltage has a gain corresponding to an effective resistance of the plurality of resistive paths;
wherein:
the means for distributing voltage from the voltage supply to the distributed load circuit further comprises a power plane; and
each resistive path among the plurality of resistive paths comprises a resistive portion of the power plane.

12. The circuit system of claim 11, wherein:
the means for distributing voltage from the voltage supply to the distributed load circuit further comprises the power plane disposed in a package; and
each resistive path among the plurality of resistive paths comprises a resistor disposed in the package.

13. The circuit system of claim 11, wherein:
the means for distributing voltage from the voltage supply to the distributed load circuit further comprises:
a package plane electrically coupled to the distributed load circuit; and
a plurality of vertical interconnect accesses (vias) that interconnect the power plane and the package plane; and
each resistive path among the plurality of resistive paths comprises a via of the plurality of vias.

14. A method for sensing a current of a distributed load circuit independent of current distribution, comprising:
determining a first average voltage of a voltage at each of a plurality of first path nodes that are electrically independent of each other, wherein each first path node of the plurality of first path nodes corresponds to a resistive path of a plurality of resistive paths corresponding to a distribution network configured to distribute voltage from a corresponding voltage supply to a corresponding distributed load circuit;
determining a second average voltage of a voltage at each of a plurality of second path nodes that are electrically independent of each other, wherein each second path node of the plurality of second path nodes corresponds to a resistive path of the plurality of resistive paths corresponding to the distribution network; and
providing an output voltage correlating to a difference of the first average voltage and the second average voltage, wherein the output voltage is proportional to a total current of the distributed load circuit, and the output voltage is based on an effective resistance of the plurality of resistive paths;
wherein:
determining the first average voltage comprises determining the first average voltage corresponding to a plurality of resistive portions of a power plane of the distribution network; and
determining the second average voltage comprises determining the second average voltage corresponding to the plurality of resistive portions of the power plane.

15. The method of claim 14, wherein:
determining the first average voltage comprises determining the first average voltage corresponding to a plurality of resistors disposed in a package electrically coupled to the distribution network, wherein the distribution network comprises the power plane; and
determining the second average voltage comprises determining the second average voltage corresponding to the plurality of resistors disposed in the package.

16. The method of claim 14, wherein:
determining the first average voltage comprises determining the first average voltage corresponding to a plurality of vertical interconnect accesses (vias) that electrically couple the distribution network and the distributed load circuit, wherein the distribution network comprises the power plane; and
determining the second average voltage comprises determining the second average voltage corresponding to the plurality of vias.

17. A circuit system, comprising:
a package comprising a distribution network, wherein the distribution network comprises a plurality of resistive paths and is configured to distribute voltage from a corresponding voltage supply to a corresponding distributed load circuit;
a semiconductor die comprising the distributed load circuit, wherein the distributed load circuit comprises a plurality of circuits;
a circuit configured to sense a current of the distributed load circuit, comprising:
a first distributed voltage averaging circuit, comprising:
a plurality of resistive circuits, wherein each resistive circuit of the plurality of resistive circuits comprises:
an input node electrically coupled to a path node of a corresponding resistive path;
an output node; and
the input nodes of the plurality of resistive circuits coupled to the path nodes of the corresponding resistive paths electrically independent of each other; and
a first voltage output node electrically coupled to the output node of each resistive circuit of the first distributed voltage averaging circuit and having a first average voltage of the distributed load circuit;
a second distributed voltage averaging circuit, comprising:
a plurality of resistive circuits, wherein each resistive circuit of the plurality of resistive circuits comprises:
an input node electrically coupled to a path node of a corresponding resistive path;
an output node; and
the input nodes of the plurality of resistive circuits coupled to the path nodes of the corresponding resistive paths electrically independent of each other; and
a second voltage output node electrically coupled to the output node of each resistive circuit of the second distributed voltage averaging circuit and having a second average voltage of the distributed load circuit; and
an amplifier comprising:
a first input node electrically coupled to the first voltage output node;
a second input node electrically coupled to the second voltage output node; and
an output node;
the amplifier configured to provide an output voltage on the output node of the amplifier proportional to a total current of the distributed load circuit, wherein the amplifier has a gain that corresponds to an effective resistance of the plurality of resistive paths;
an analog-to-digital converter comprising:
   an input node coupled to the output node of the amplifier; and
   an output node having a digital signal that is a digital representation of the output voltage; and
a control circuit configured to:
   receive the digital signal; and
   responsive to the digital signal exceeding a defined threshold value, adjust one or more parameters of one or more circuits of the plurality of circuits of the distributed load circuit such that the total current is less than or equal to a maximum current level;
wherein:
   the distribution network comprises a power plane; and
   each resistive path among the plurality of resistive paths comprises a resistive portion of the power plane.

18. The circuit system of claim 17, wherein:
the distributed load circuit comprises a multiprocessor circuit; and
each circuit of the one or more circuits comprises a processor core circuit disposed in the multiprocessor circuit.

19. The circuit system of claim 17, wherein:
the distribution network comprises the power plane disposed in the package; and
each resistive path among the plurality of resistive paths comprises a resistor disposed in the package.

20. The circuit system of claim 17, wherein:
the distribution network comprises:
   a package plane electrically coupled to the distributed load circuit; and
   a plurality of vertical interconnect accesses (vias) that interconnect the power plane and the package plane; and
   each resistive path among the plurality of resistive paths comprises a via of the plurality of vias.

21. The circuit system of claim 17, wherein:
each resistive circuit among the plurality of resistive circuits of the first distributed voltage averaging circuit comprises at least one resistor; and
each resistive circuit among the plurality of resistive circuits of the second distributed voltage averaging circuit comprises at least one resistor.

22. The circuit system of claim 17, wherein each resistive path among the plurality of resistive paths has a substantially equal resistance.

23. The circuit system of claim 17, wherein at least one resistive path among the plurality of resistive paths has a resistance that is neither equal nor substantially equal to a resistance of the remaining resistive paths.

24. The circuit system of claim 17, wherein:
the input node of each resistive circuit of the first distributed voltage averaging circuit is electrically coupled to a node of a corresponding resistive path of the plurality of resistive paths; and
the input node of each resistive circuit of the second distributed voltage averaging circuit is electrically coupled to another node of the corresponding resistive path of the plurality of resistive paths.

25. The circuit system of claim 17, wherein:
the input node of each resistive circuit of the first distributed voltage averaging circuit is electrically coupled to a node of a corresponding resistive path of the plurality of resistive paths; and
the input node of each resistive circuit of the second distributed voltage averaging circuit is electrically coupled to a node of a corresponding resistive path of the plurality of resistive paths that is not electrically coupled to the first distributed voltage averaging circuit.

* * * * *